US011668554B2

(12) United States Patent
Shen et al.

(10) Patent No.: US 11,668,554 B2
(45) Date of Patent: Jun. 6, 2023

(54) ELECTROMECHANICAL SENSOR AND A METHOD OF SENSING AN OBJECT OR A TACTILE INPUT USING THE SENSOR

(71) Applicants: City University of Hong Kong, Kowloon (HK); The University of Hong Kong, Pokfulam (HK)

(72) Inventors: Yajing Shen, Kowloon (HK); Youcan Yan, Kowloon (HK); Jia Pan, Pokfulam (HK)

(73) Assignees: City University of Hong Kong, Kowloon (HK); Versitech Limited, Pok Fu Lam (HK)

( * ) Notice: Subject to any disclaimer, the term of this patent is extended or adjusted under 35 U.S.C. 154(b) by 198 days.

(21) Appl. No.: 17/188,182

(22) Filed: Mar. 1, 2021

(65) Prior Publication Data

US 2022/0276038 A1    Sep. 1, 2022

(51) Int. Cl.
| | | |
|---|---|---|
| G01R 33/06 | (2006.01) | |
| G01B 7/14 | (2006.01) | |
| G01B 7/24 | (2006.01) | |
| G01L 1/12 | (2006.01) | |
| G01V 3/08 | (2006.01) | |
| G01R 33/07 | (2006.01) | |
| G01D 5/14 | (2006.01) | |
| G01D 11/24 | (2006.01) | |

(52) U.S. Cl.
CPC .............. *G01B 7/24* (2013.01); *G01L 1/12* (2013.01); *G01R 33/07* (2013.01); *G01R 33/072* (2013.01); *G01R 33/077* (2013.01); *G01V 3/08* (2013.01); *G01D 5/145* (2013.01); *G01D 5/147* (2013.01); *G01D 11/245* (2013.01)

(58) Field of Classification Search
CPC .. G01B 7/24; G01L 1/12; G01L 5/228; G01V 3/08; B25J 13/084; G01D 5/145; G01D 5/147; G01D 11/245; G01R 33/07; G01R 33/072; G01R 33/077
USPC ........ 324/51, 55, 200, 207.11, 207.13, 207.2
See application file for complete search history.

(56) References Cited

U.S. PATENT DOCUMENTS

| | | | |
|---|---|---|---|
| 2006/0209467 A1* | 9/2006 | Kim ...................... | B82Y 10/00 360/313 |
| 2016/0346934 A1* | 12/2016 | Chang ....................... | G01L 1/12 |
| 2020/0116579 A1* | 4/2020 | Schanz .................... | G01L 1/127 |
| 2020/0393314 A1* | 12/2020 | Shimizu .................. | G01L 5/228 |

(Continued)

OTHER PUBLICATIONS

A. Billard, D. Kragic, Trends and challenges in robot manipulation. Science 364, 6446 (2019).

(Continued)

*Primary Examiner* — Raul J Rios Russo
(74) *Attorney, Agent, or Firm* — Renner Kenner Greive Bobak Taylor & Weber

(57) ABSTRACT

An electromechanical sensor and a method of sensing an object or a tactile input using the sensor. The sensor includes: a base provided with a magnetic sensor arranged to detect a change in magnetic flux at the position of the magnetic sensor; a flexible film adjacent to the magnetic sensor; and a magnetic element provided on the flexible film; wherein the magnetic element is arranged to move relative to the magnetic sensor when the flexible film is reversibly deformed by an external force applied to the flexible film.

30 Claims, 33 Drawing Sheets
(5 of 33 Drawing Sheet(s) Filed in Color)

(56) References Cited

U.S. PATENT DOCUMENTS

2022/0326001 A1* 10/2022 Zhao .................. G01B 7/24
2022/0349695 A1* 11/2022 Hellebrekers ............ G01B 7/24

OTHER PUBLICATIONS

C. Bartolozzi, L. Natale, F. Nori, G. Merta, Robots with a sense of touch. Nat. Mater. 15, 921 (2016).
S. Maksimovic, M. Nakatani, Y. Baba, A. M. Nelson, K. L. Marshall, S. A. Welinitz, E. A. Lumpkin, Epidermal Merkel cells are mechanosensory cells that tune mammalian touch receptors. Nature 509, 617-621 (2014).
H. E. Wheat, L. M. Salo, A. W. Goodwin, Cutaneous afferents from the monkeys fingers: Responses to tangential and normal forces. J. Neurophysiol. 103,950-961 (2010).
J. R. Phillips, R. S. Johansson, K. 0. Johnson, Representation of braille characters in human nerve fibres. Exp. Brain Res. 81, 457-472 (1990).
N. F. Lepora, U. Martinez-Hernandez, M. Evans, L. Natale, G. Merta, T. J. Prescott, Tactile superresolution and biomimetic hyperacuity. IEEE Trans. Robot. 31, 605-618 (2015).
C. M. Boutry, M. Negre, M. Jorda, 0 . Vardoulis, A. Chortos, 0 . Khatib, Z. Bao, A hierarchically patterned, bioinspired e-skin able to detect the direction of applied pressure for robotics. Sci. Robot. 3, eaau6914 (20 18).
L. Viry, A. Levi, M. Totaro, A. Mondini, V. Mattoli, B. Mazzolai, L. Beccai, Flexible three-axial force sensor for soft and highly sensitive artificial touch. Adv. Mater. 26, 2659-2664 (2014).
H. K. Lee, J. Chung, S. I. Chang, E. Yoon, Real-time measurement of the three-axis contact force distribution using a flexible capacitive polymer tactile sensor. J. Micromech. Microeng. 21, 035010 (2011).
Z. Chu, P.M. Sarro, S. Middelhoek, Silicon three-axial tactile sensor. Sens. Actuators A: Phys. 54, 505-5 I 0 ( 1996).
J. Park, M. Kim, Y. Lee, H. S. Lee, H. Ko, Fingertip skin-inspired microstructured ferroelectric skins discriminate static/dynamic pressure and temperature stimuli. Sci. Adv. 1, el500661 (2015).
Z. Zou, C. Zhu, Y. Li, X. Lei, W. Zhang, J. Xiao, Rehealable, fully recyclable, and malleable electronic skin enabled by dynamic covalent thermoset nanocomposite. Sci. Adv. 4, eaaq0508 (20 18).
C. Mu, Y. Song, W. Huang, A. Ran, R. Sun, W. Xie, H. Zhang, Flexible normal-tangential force sensor with opposite resistance responding for highly sensitive artificial skin. Adv. Funct. Mater. 28, 1-9 (2018).
C. W. Ma, L. S. Hsu, J. C. Kuo, Y. J. Yang, A flexible tactile and shear sensing array fabricated using a novel buckypaper patterning technique. Sens. Actuators A: Phys. 231, 21-27 (2015).
X. Sun, J. Sun, T. Li, S. Zheng, C. Wang, W. Tan, C. Liu, Flexible tactile electronic skin sensor with 3d force detection based on porous CNTs/PDMS nanocomposites. Nanomicro. Lett. 11, 57 (20 19).
M. K. Kang, S. Lee, J. H. Kim, Shape optimization of a mechanically decoupled six-axis force/torque sensor. Sens. Actuators A: Phys. 209, 41-51 (20 14).
J. Zhang, L. J. Zhou, H. M. Zhang, Z. X. Zhao, S. L. Dong, S. Wei, P. A. Hu, Highly sensitive flexible three-axis tactile sensors based on the interface contact resistance of microstructured graphene. Nanoscale 10,7387-7395 (2018).
B. Ward-Cherrier, N. Pestell, L. Cramphorn, B. Winstone, M. E. Giannaccini, J. Rossiter, and N. F. Lepora, The tactip family: Soft optical tactile sensors with 3d-printed biomimetic morphologies. Soft. Robot. 5, 216-227 (2018).
G. Palli, L. Moriello, U. Scarcia, C. Melchiorri, Development of an optoelectronic 6-axis force/torque sensor for robotic applications. Sens. Actuators A: Phys. 220, 333-346 (201 4).
W. Yuan, S. Dong, E. H. Adelson, GelSight: High-resolution robot tactile sensors for estimating geometry and force, Sensors (Basel), 17, 2762 (2017).
H. Wang, G. de Boer, J. Kow, A. Alazmani, M. Ghajari, R. Hewson, P. Culmer, Design methodology for magnetic field-based soft tri-axis tactile sensors, Sensors (Basel) 16, 1356 (2016).
C. Ledermann, S. Wirges, D. Oertel, M. Mende, H. Woern, Tactile Sensor on a Magnetic Basis using novel 3D Hall sensor-First prototypes and results, in 2013 IEEE 17th International Conference on Intelligent Engineering Systems (INES), (IEEE, 2013), pp. 55-60.
T. P. Tomo, M. Regoli, A. Schmitz, L. Natale, H. Kristanto, S. Somlor, S. Sugano, A new silicone structure for uSkin—a soft, distributed, digital 3-axis skin sensor—and its integration on the humanoid robot iCub. IEEE Robot. Autom. Lett. 3, 1-1 (2018).
Y. Wu, Y. Liu, Y. Zhou, Q. Man, C. Hu, W. Asghar, R.-W. Li, A skin-inspired tactile sensor for smart prosthetics. Sci. Robot. 3, eaat0429 (20 18).
J. Ge, X. Wang, M. Drack, 0. Volkov, M. Liang, G. S. CaMn Bermudez, D. Makarov, A bimodal soft electronic skin for tactile and touchless interaction in real time. Nat. Commun. 10, 1-10 (2019).
P. Piacenza, S. Sherman, M. Ciocarlie, Data-driven superresolution on a tactile dome. IEEE Robot. Autom. Lett. 3, 1434-1441 (2018).
Van Meerbeek, C. De Sa, R. Shepherd, Soft optoelectronic sensory foams with proprioception. Sci. Robot. 3, eaau2489 (2018).
T. G. Thuruthel, B. Shih, C. Laschi, M. T. Tolley, Soft robot perception using embedded soft sensors and recurrent neural networks. Sci. Robot. 4, eaav1488 (2019).
W. W. Lee, Y. J. Tan, H. Yao, S. Li, H. H. See, M. Hon, K. A. Ng, B. Xiong, J. S. Ho, B. C. K. Tee, A neuro-inspired artificial peripheral nervous system for scalable electronic skins. Sci Robot. 4, eaax2198 (2019).
B. Shih, D. Shah, J. Li, T. G. Thuruthel, Y.-L. Park, F. Iida, Z. Bao, R. Kramer-Bottiglio, M. T. Tolley, Electronic skins and machine learning for intelligent soft robots. Sci. Robot. 5, eaaz9239 (2020).
S. Sundaram, P. Kellnhofer, Y. Li, J. Y. Zhu, A. Torralba, W. Matusik, Learning the signatures of the human grasp using a scalable tactile glove. Nature, 569, 698-702 (2019).
C. Larson, J. Spjut, R. Knepper, R. Shepherd, A deformable interface for human touch recognition using stretchable carbon nanotube dielectric elastomer sensors and deep neural networks. Soft Robot. 6, 611-620 (20 19).
D. Kim, J. Kwon, B. Jeon, Y.-L. Park, Adaptive calibration of soft sensors using optimal transportation transfer learning for mass production and long-term usage. Adv. Intel!. Syst. 2020, 1900178 (2020).
D. Kim, J. Kwon, S. Han, Y.-L. Park, S. Jo, Deep full-body motion network (dfm-net) for a soft wearable motion sensing suit. IEEE/ASME Trans. Mechatron. 24, 18453663 (2018).
L. G. Cohen, P. Celnik, A. Pascuai-Leone, B. Corwell, L. Faiz, J. Dambrosia, M. Hallett, Functional relevance of cross-modal plasticity in blind humans. Nature 389, I 80-183 (I 997).
J. C. Mallinson, One-sided fluxes—A magnetic curiosity? IEEE Trans. Magn. 9, 678-682 (I 973).
A. W. Goodwin, H. E. Wheat, Effects of nonuniform fiber sensitivity, innervation geometry, and noise on information relayed by a population of slowly adapting type I primary afferents from the fingerpad. J. Neurosci. 19, 8057-8070 (1999).
K. B. Shimoga, Robot grasp synthesis algorithms: A survey. Int. J. Rob. Res. 15, 230-266 (1996).
S. Amato, Standards for competence in braille literacy skills in teacher preparation programs. J. Vis. Impair. Blind. 96, 143-153 (2002).
S. Isayed, R. Tahboub, A review of optical Braille recognition, in World Symposium on Web Applications and Networking (WSW AN) (IEEE, 20 15), pp. 1-6.
X. F. Zhao, C.Z. Hang, H. L. Lu, K. Xu, H. Zhang, F. Yang, D. W. Zhang, A skin-like sensor for intelligent Braille recognition. Nano Energy 68, 104346 (2020).
B. Hermelin, N. O'Connor, Functional asymmetry in the reading of Braille. Neuropsychologia 9, 431-435 (1971).

* cited by examiner

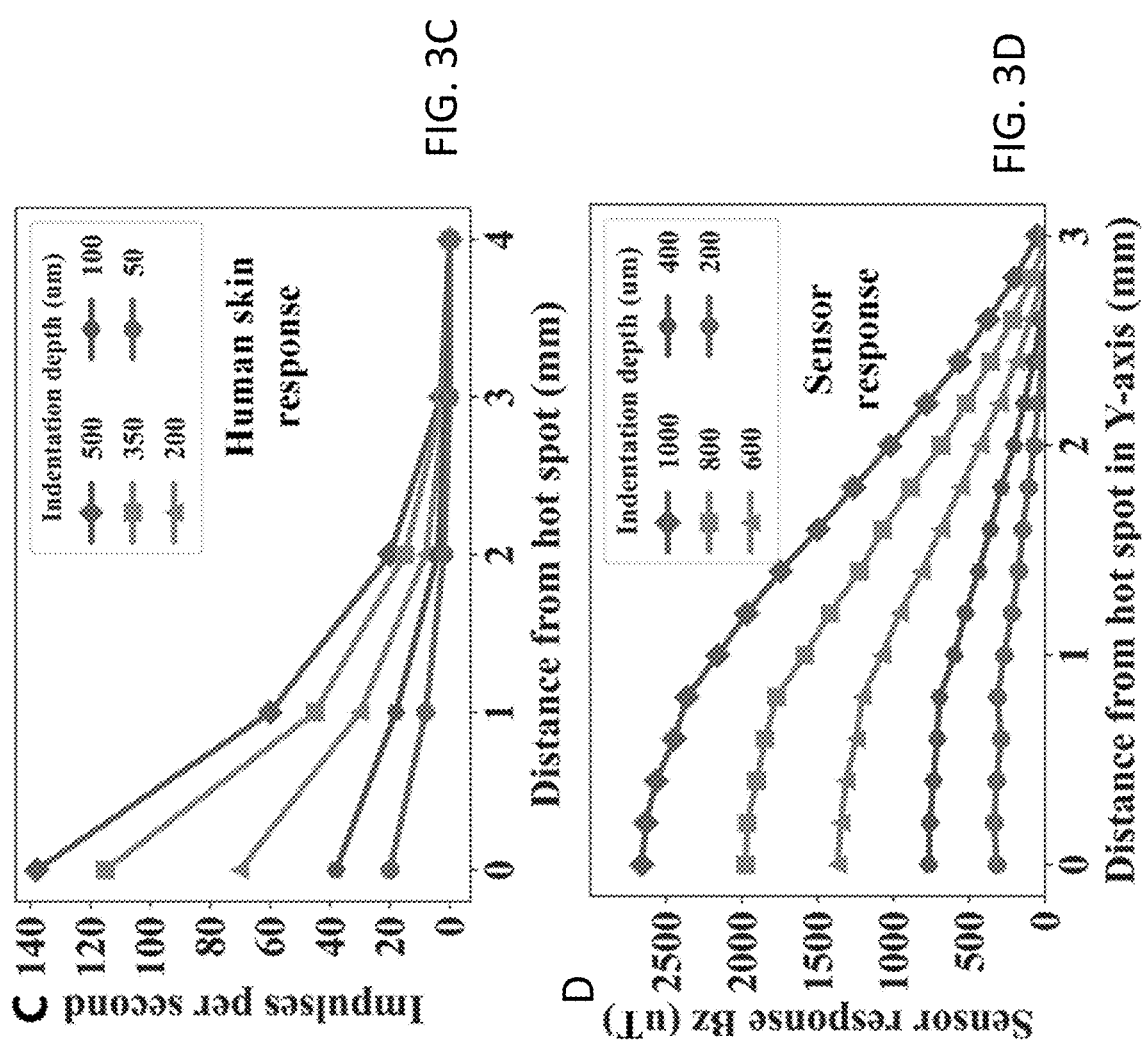

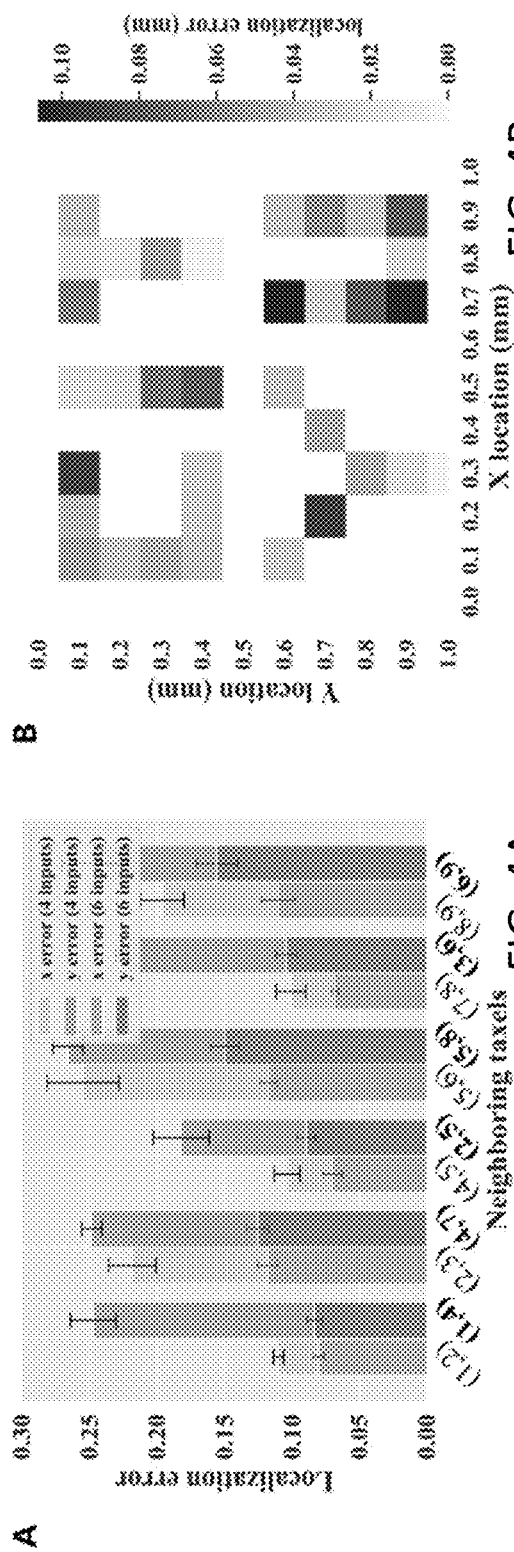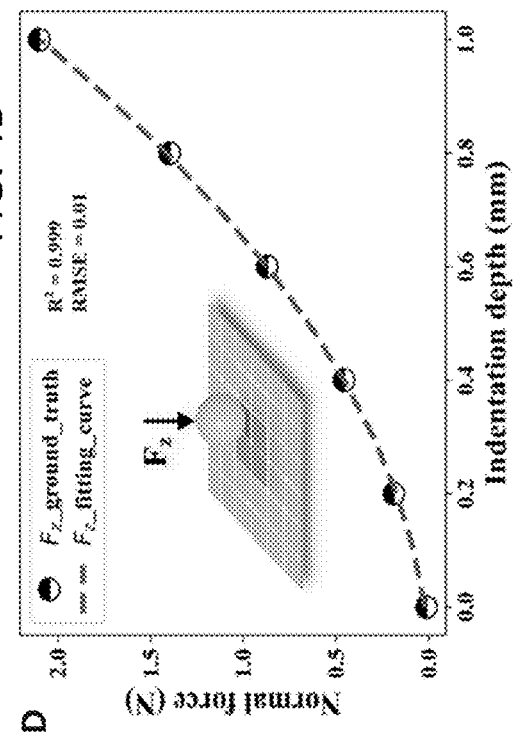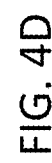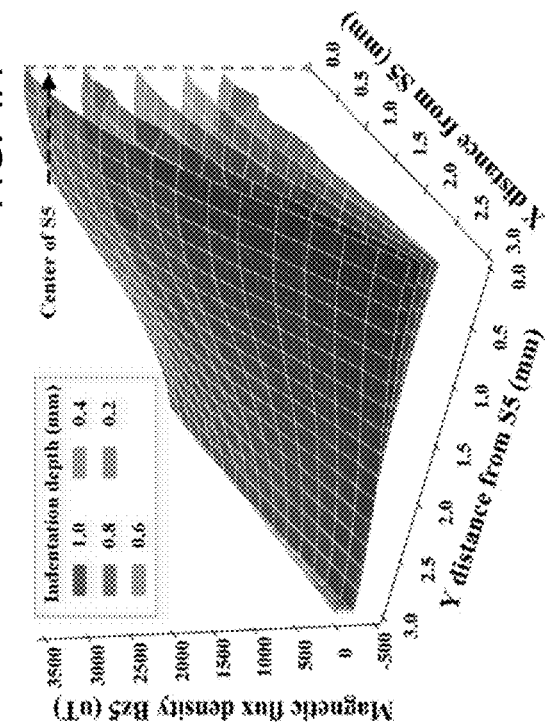
FIG. 4A
FIG. 4B
FIG. 4C
FIG. 4D

| | 2-axis (x–z) | 3-axis (x–y–z) |
|---|---|---|
| Magnetization pattern |  |  |
| Magnetization formula | $M_x = M_0 \sin(kx)$<br>$M_z = M_0 \cos(kx)$<br>$M_y = 0$ | $M_r = M_0 \sin(kx)$<br>$M_z = M_0 \cos(kx)$ |
| Force decoupling ability | 2-axis (x–z) | 3-axis (x–y–z) |

ELECTROMECHANICAL SENSOR AND A METHOD OF SENSING AN OBJECT OR A TACTILE INPUT USING THE SENSOR

TECHNICAL FIELD

The invention relates to an electromechanical sensor and a method of sensing an object or a tactile input using the sensor, and particularly, although not exclusively, to a soft tactile sensor based on magnetic sensing.

BACKGROUND

Robots may perform various tasks in different situations, and are especially useful in dangerous environments. In some applications, repeated tasks may be preferably performed by robots to save human from injuries or fatigue, however in many daily-life applications it is not easily for machine or robots to imitate motions of human beings due to the lack of precise tactile sensing.

SUMMARY OF THE INVENTION

In accordance with a first aspect of the invention, there is provided an electromechanical sensor comprising: a base provided with a magnetic sensor arranged to detect a change in magnetic flux at the position of the magnetic sensor; a flexible film adjacent to the magnetic sensor; and a magnetic element provided on the flexible film; wherein the magnetic element is arranged to move relative to the magnetic sensor when the flexible film is reversibly deformed by an external force applied to the flexible film.

In an embodiment of the first aspect, the magnetic element includes magnetic powders distributed across the flexible film.

In an embodiment of the first aspect, the magnetic powders include neodymium.

In an embodiment of the first aspect, the magnetic element has a non-uniform magnetization pattern across the flexible film.

In an embodiment of the first aspect, the non-uniform magnetization pattern includes a sinusoidal pattern.

In an embodiment of the first aspect, the sinusoidal pattern repeats periodically along at least one axis of the flexible film.

In an embodiment of the first aspect, the sinusoidal pattern repeats periodically and radially thereby defining the magnetization pattern with a plurality of concentric rings.

In an embodiment of the first aspect, the magnetic powders form a Halbach array.

In an embodiment of the first aspect, the flexible film comprises a polymer.

In an embodiment of the first aspect, the polymer includes polydimethylsiloxane.

In an embodiment of the first aspect, the magnetic sensor is aligned with a magnetic pole of the magnetic element.

In an embodiment of the first aspect, the magnetic sensor includes at least one hall sensor mounted on the base.

In an embodiment of the first aspect, the base comprises a printed circuit board.

In an embodiment of the first aspect, the base comprises a flexible printed circuit.

In an embodiment of the first aspect, the magnetic sensor includes an array of hall sensors mounted on the base.

In an embodiment of the first aspect, the flexible film defines a curved sensing surface.

In an embodiment of the first aspect, the sensor further comprises a spacer layer between the base and the flexible film.

In an embodiment of the first aspect, the spacer layer is arranged to partially absorb the external force applied to the flexible film and/or to restore the flexible film to an original state.

In an embodiment of the first aspect, the spacer layer comprises an elastomer material.

In an embodiment of the first aspect, the elastomer material includes silicone.

In an embodiment of the first aspect, the external force includes a combination of shear force and normal force.

In an embodiment of the first aspect, the magnetic sensor is arranged to decouple the combined external force to the shear force and the normal force applied to the flexible film.

In accordance with a second aspect of the invention, there is provided a sensor array comprising a plurality of electromechanical sensor in accordance with the first aspect.

In accordance with a third aspect of the invention, there is provided a method of sensing an object or a tactile input, comprising the steps of: receiving a detection signal provided by the magnetic sensor in the electromechanical sensor in accordance with the first aspect, wherein the detection signal is generated in response to a movement of the magnetic element on the flexible film, decoupling the external force to a shear force component and a normal force component in terms of a magnetic ratio $R_B$ and a magnetic strength B of the magnetic flux sense by the magnetic sensor; and determining the shear force and the normal force applied to the flexible film.

In an embodiment of the third aspect, the method further comprises the step of processing the detection signal to determine a position and/or a depth of a pressing force applied to the flexible film.

In an embodiment of the third aspect, the step of processing the detection signal includes processing a magnetic flux density of neighbouring taxels in the magnetic sensor around the position of the pressing force applied to the flexible film.

In an embodiment of the third aspect, the step of processing the detection signal includes measuring a magnetic flux density at the position of the pressing force applied to the flexible film to determine the depth of the pressing force with reference to a pre-calibrated lookup table.

In an embodiment of the third aspect, the step of processing the detection signal includes measuring the depth at the position of the pressing force applied to the flexible film to determine a force magnitude of the pressing force with reference to a pre-calibrated lookup table.

In an embodiment of the third aspect, the step of processing the detection signal include estimating coordinates of the position of the pressing force applied to the flexible film using a neural network.

In an embodiment of the third aspect, the method further comprises the step of tracking a motion of an object corresponding to external forces applied on the flexible film by the object during a predetermined period of time.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Embodiments of the invention will now be described, by way of example, with reference to the accompanying drawings in which:

FIGS. 3C and 3D are plots showing responses of the human skin and the tactile sensor to the spherical indentation of different depths and locations respectively.

FIG. 4A is a chart showing the 5-fold cross-validation error (in terms of the mean absolute error) of the tactile super-resolution method described in FIG. 3E.

FIG. 4B is a color map showing validation results of the contact localization with super-resolution. An indenter of a spherical head is pressed on the different locations of the sensor surface within a 1 mm×1 mm contact region in a pattern of "CITYU", and the localization error at each contact point is shown.

FIG. 4C is a plot showing a relationship between the magnetic flux density, the contact location, and the indentation depth, from which it is possible to look up the indentation depth according to the current magnetic flux density and the contact location in the method of FIG. 3E estimated with the neural network model.

FIG. 4D is a plot showing a relationship between the normal force and the indentation depth, a quadratic function is fitted for the measured data and use it to predict contact forces from the indentation depth in the method of FIG. 3E.

DETAILED DESCRIPTION OF THE PREFERRED EMBODIMENT

Figure 1A:
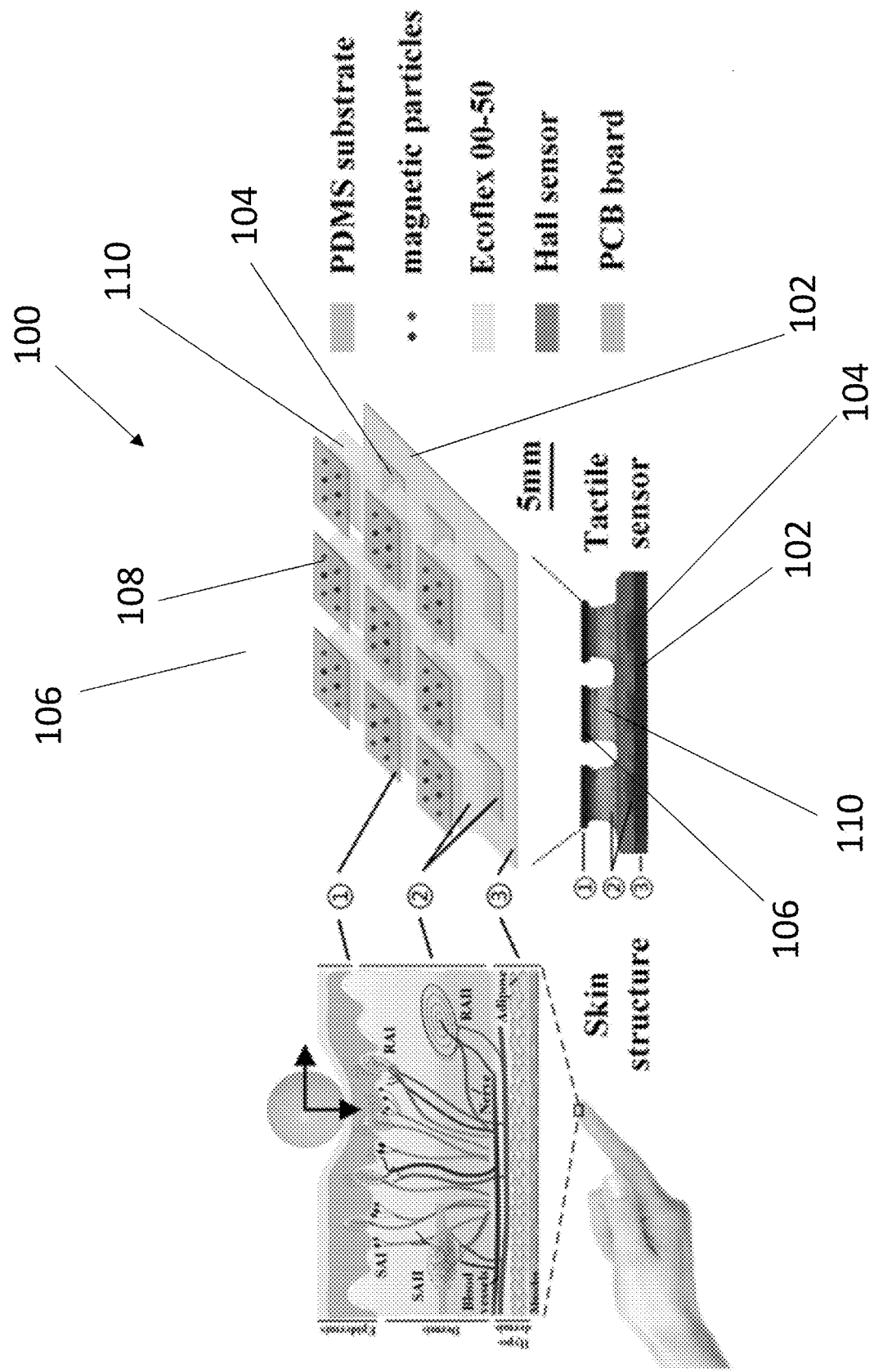
FIG. 1A is an illustration showing a perspective view and a side view electromechanical sensor according to one embodiment of the invention, and the electromechanical sensor is designed according to the biological features in human skin shown on the left.

Human skin can sense the subtle changes of both normal and shear forces (self-decoupled), as well as perceive the stimulus detail finer than the average spacing between mechanoreceptors (super-resolved). Therefore, human hands are amazingly skilled at recognizing texture and handling objects with different shapes and sizes. By contrast, some tactile sensors for robots may be relatively inferior, lacking accurate force decoupling and proper spatial resolution at the same time.

The inventors have, through their own research, trials and experiments, devised that, this may impose a negative impact on the robots' performance in many tasks like dexterous grasping and manipulation. To overcome this problem, a bio-inspired tactile sensor with skin-comparable self-decoupling and super-resolution abilities may be used.

The inventors devised that it is preferable to design a flexible mechanical hand and a system with the same ability. For example, dexterous hands have to be improved to achieve fine tactile feedback (e.g., contact force) and dexterous daily operation (e.g., adaptive grasping), one of the main reasons for this is that the designed hands lack skin-comparable artificial tactile sensors. In fact, it has been known that human skin, which mainly consists of four types of mechanoreceptors (SA-I, II and RA-I, II), is able to perceive tactile stimulus at a spatial resolution higher than the average spacing between mechanoreceptors in the finger (known as the tactile hyperacuity or super-resolution) and to simultaneously distinguish the normal force and the shear force in a decoupled way.

Through the rich tactile feedback from the skin, humans can precisely and reliably recognize, grab, manipulate and deform an unstructured object by dynamically adjusting the finger pose and contact force. Hence, designing tactile sensors with skin-like characters is of considerable importance in improving the robot's capability and would significantly benefit a wide variety of industrial and domestic applications.

Preferably, artificial tactile sensors for perception may be based on a wide variety of transduction principles including capacitance, piezoresistance, optics, magnetics, giant magnetoresistance, and barometric pressure, within which machine learning technologies may also play an important role to map the raw sensory information to relevant functional abstractions for these sensors.

Among all, the tactile sensor arrays and the latest optical-based sensors can achieve super-resolution comparable to human skin, but the shortcomings in bulky structure or solely normal force sensing limit their applications in robotic tasks that require compact sensor structure and involve both the normal and shear forces.

Without wishing to be bound by theory, advanced materials may enable shear force detection through a complicated electrode structure. However, the normal and the shear forces are not naturally decoupled and only the normal (or shear) force under a constant shear (or normal) load, rather than all loads combinations, is calibrated. Although an approximated decoupling model can be built by fitting the coupled data of all combinations of normal and shear loads, its practical application remains a big challenge since the calibration is time-consuming and is prone to over-fitting.

In some example embodiments, mechanical decoupling may be used for accurately separating the normal and tangential force signals, but sensors based on mechanical decoupling may not be suitable for daily grasping and manipulation tasks considering the complex and bulky structure as well as the undeveloped super-resolution ability. Therefore, the two intrinsic characteristics of human skin—super-resolution and self-decoupling—are needed to be simultaneously accomplished in an artificial tactile sensor.

In one example embodiment of the present invention, a sinusoidally magnetized flexible magnet film (with the thickness ~0.5 mm) may be used to improve the sensing methodology. The sensor may accurately measure the normal force and the shear force (demonstrated in one dimension) with a single unit, and achieve a 60-fold super-resolved accuracy enhanced by deep learning.

For example, with the novel sensor being mounted at the fingertip, robots can accomplish challenging tasks like stably grasping fragile objects under external disturbance and threading a needle via teleoperation. Moreover, the sensor may be used in Braille character recognition by sliding the sensor (mounted on a robotic arm) over the Braille surface, in which a real-time recognition accuracy of 97% was observed in an experimental operation, which is as proficiently as humans.

Advantageously, the tactile sensor of the preferred embodiments may be beneficial to relevant robotic fields and tasks, such as adaptive grasping, dexterous manipulation, accurate texture recognition, and human-robot interaction.

Figure 1B:
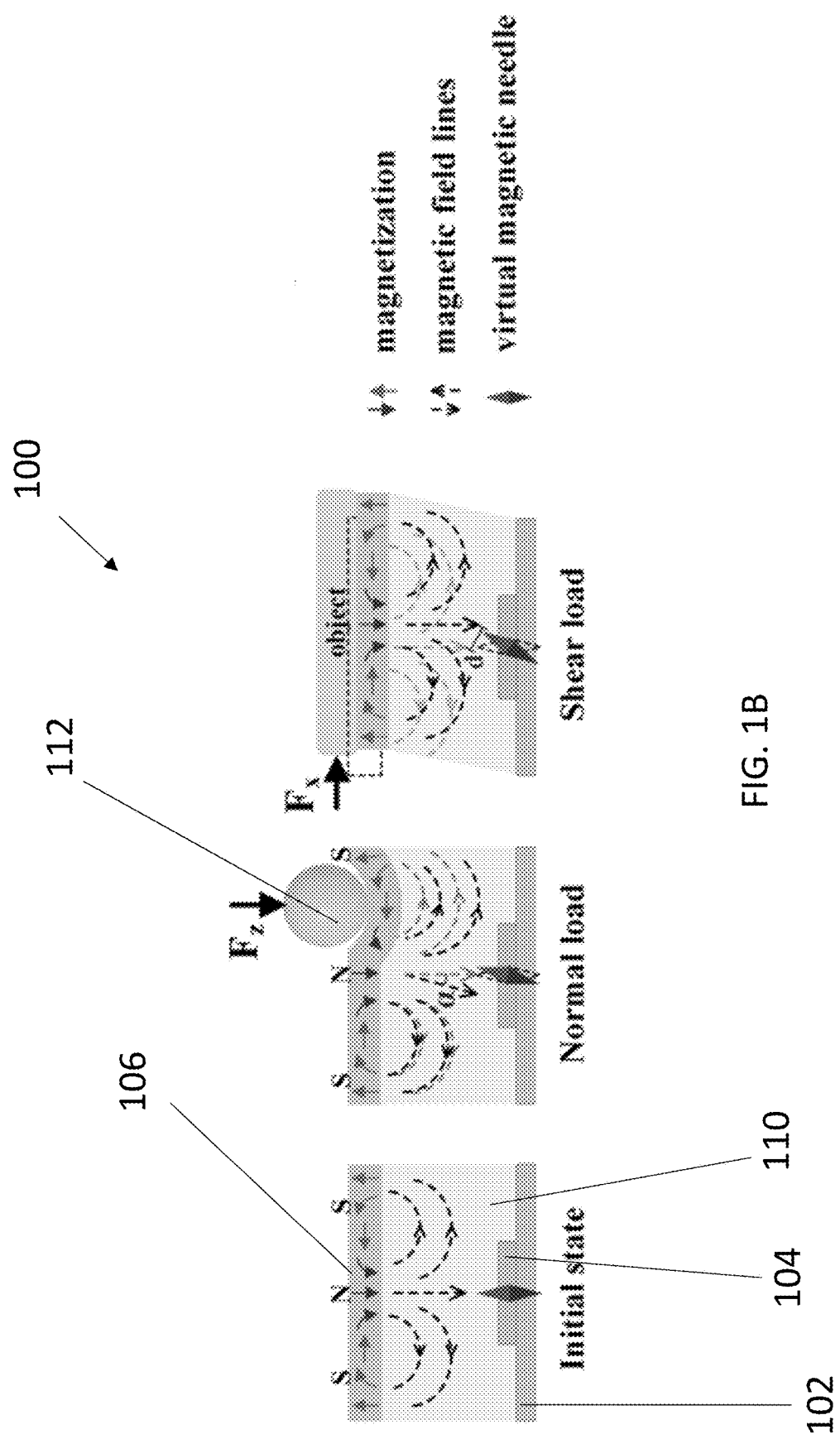
FIG. 1B is an illustration of the working principle of the electromechanical sensor of FIG. 1A. Left: the initial state (no-loading) of the sensor. Middle: the partial deformation of the sensor under a spherical indentation (normal load). Right: the overall deformation of the sensor under the shear load (contain both normal forces caused by the weight of the object and the shear force applied externally).

With reference to FIGS. 1A and 1B, there is shown an embodiment of an electromechanical sensor 100 comprising: a base 102 provided with a magnetic sensor 104 arranged to detect a change in magnetic flux at the position of the magnetic sensor 104; a flexible film 106 adjacent to the magnetic sensor 104; and a magnetic element 108 provided on the flexible film 106; wherein the magnetic element 108 is arranged to move relative to the magnetic sensor 104 when the flexible film 106 is reversibly deformed by an external force applied to the flexible film 106.

In this example, the tactile sensor 100 with both the super-resolution and self-decoupling capabilities mimicks the force sensing abilities of human skin. These features may be achieved by a sandwich structure that consists of a flexible magnet film 106, a silicone elastomer layer 110, and a Hall sensor 104.

Referring to FIG. 1A, the sensor 100 has a layer of flexible film 106, such as a polymer film, suspending above the base 102, such that when the film 106 is subjected to an external force, e.g. being depressed towards the base 102, the film 106 is deformed with a portion of the film moving towards to the base 102. By determining the change in relative distance between the flexible film 106 and the base 102, attributes of the external force may be determined.

Preferably, the flexible film 106 is provided with magnetic element including magnetic powders 108, such as neodymium magnetic powder, distributed across the flexible film 106, such that the polymer film 106 produces a magnetic flux, and the magnetic flux may be sensed by a magnetic sensor 104 proximate to the flexible film 106. For example, magnetic sensors such as hall sensors 104 may be mounted on the base 102 to detect the change of magnetic flux induced by the change of relative distance between the film 106 and the base 102.

More preferably, the magnetic element 108 has a non-uniform magnetization pattern across the flexible film 106. For example, the flexible magnet sheet may be sinusoidally magnetized with multiple pairs of north-south magnetic poles, which successfully overcomes the inherent problem of the strong cross-coupling effects in some other magnet-based tactile sensors. As a result, the electromechanical sensor 100 may naturally decouple the normal and shear forces, and dramatically simplifies the sensor structure and the calibration process compared to other sensors.

The tactile sensor 100 further comprises a spacer layer 110, such as silicone, between the base 102 and the flexible film 106, for partially absorbing the external force applied to the flexible film 106 and/or to restore the flexible film 106 to an original state. Referring to FIG. 1A, the tactile sensor 100 has a sandwich structure to sense the external force, and the sandwich structure is similar to the functionalized multi-layer structure of human skin as shown in the Figure.

In an exemplary embodiment of the electromechanical sensor 100 the present invention, the top layer is made of the flexible magnet film (E~2 MPa, thickness 0.5 mm) with a one-dimensional sinusoidal magnetization pattern, and the magnetic powders are arranged to form a Halbach array. The middle layer is made of the soft silicone elastomer (thickness 3.5 mm, Ecoflex 00-50, Smooth-on Inc.) with a lower elastic modulus (E~83 kPa). The bottom layer is a hard PCB (thickness 1.6 mm) with a Hall sensor mounted, which can be replaced with a flexible printed circuit (FPC) when necessary.

In this example, the flexible magnet is a mixture of Polydimethylsiloxane (PDMS) and Neodymium (NdFeB) magnetic powders with a weight ratio of 1:3, and it was fabricated using the master mold technique. After 2 hours of curing at 80° C., the flexible magnet was magnetized under a strong rotating magnetic field generated by the electromagnet. The Hall sensor (MLX90393) used for measuring the magnetic field is commercially available from Melexis (Belgium). And the elastomer sandwiched between the flexible magnet and the Hall sensor on PCB is Ecoflex 00-50, which was directly cast on the PCB.

The flexible magnet may be bonded onto the elastomer by using an intermediate pre-polymerized mixture of PDMS and Ecoflex 00-50. Before the mixture cured, the position of the flexible magnet can be freely adjusted until the centers of the magnetic pole and the Hall sensor is perfectly aligned, and then the entire structure was heated to cure the mixture and keep the alignment permanently.

With reference also to FIG. 1B, when an external force, such as a weight 112, is applied to the top layer 106, the Hall sensor 104 embedded in the middle layer senses the deformation of the magnetic film 106 according to the changing magnetic flux densities.

To optimize the sensor performance in terms of the measurement range and sensitivity, several parameters may be carefully considered, including the thickness of the top layer d, the magnetic period of the magnet film T, and the thickness of the middle layer h.

The external force may be a combination of shear force and normal force, which is needed to be decoupled by the sensor for further processing. When an external force F is applied to the flexible magnet (top layer), the magnetic flux under the flexible magnet film changes. The deformation, either from the normal or shear direction, can be sensed by the embedded Hall sensor at the middle layer and then converted to electric signals via the PCB. The relationship between the normal force $F_z$ and the magnetic field rotation angle $\alpha$ (or displacement $d_z$ along the z-axis) can be obtained after calibration. Furthermore, the relationship between the shear force $F_x$ and the translational movement of the magnetic field $d_x$ (displacement component of d along the x-axis) can be simply described by Hooke's law: $F_x = S \cdot G \cdot (d_x/h)$, where S is the contact area and G is the shear modulus.

According to the magnetic properties of the Halbach arrays, the overall (resultant) magnetic flux density B(x,z) and the ratio $R_B(x,z)$ (equals to $B_x/B_z$, where $B_x$ and $B_z$ are the magnetic flux densities along the x and z directions, respectively) at any point (x,z) under the flexible magnet film can be described as:

$$\begin{bmatrix} B(x,z) \\ R_B(x,z) \end{bmatrix} = \begin{bmatrix} M_0(e^{kd} - 1)e^{-kz} \\ \tan(kx) \end{bmatrix} \quad (1)$$

where $M_0$ is the magnetization magnitude, k is the wavenumber ($k=2\pi/T$).

Preferably, d may be set as 0.5 mm to balance the tradeoff between the sensor thickness and the remnant magnetic strength of the magnetic film. The experimental results indicate that such value can ensure both the flexibility and robustness of the sensor, i.e., Eq. (1) is always valid during the overall deformation of the sensor and the magnet film can maintain a high magnetic strength (as shown in FIG. 7).

Figure 7:
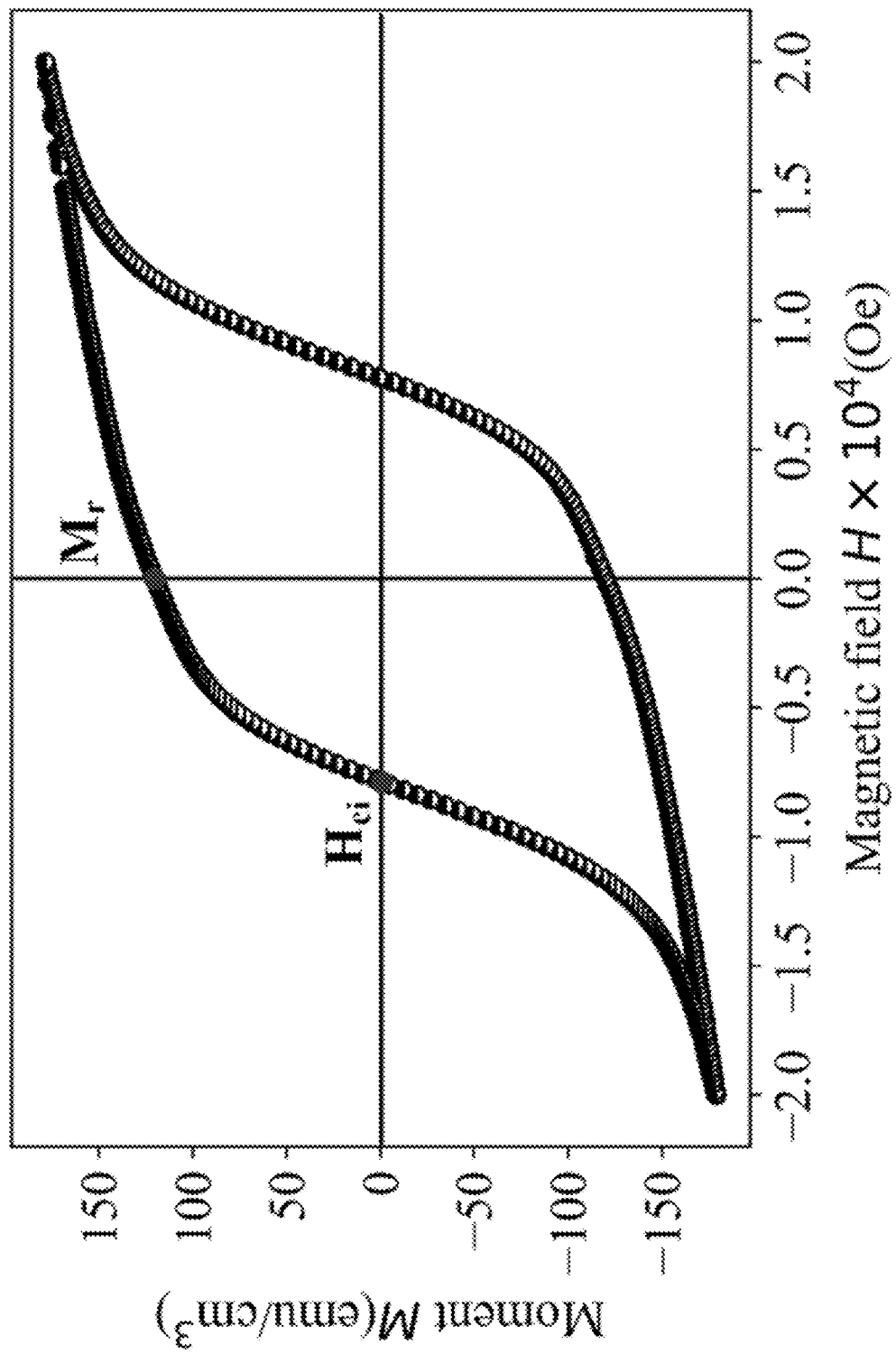
FIG. 7 is a plot showing a magnetization loop of the flexible magnet film.

With reference to FIG. 7, the magnetization loop (or M-H loop) of the flexible magnetic film was measured with MPMS3 (Quantum Design Inc., San Diego, USA), from which it is observed that the remanent magnetization $M_r$ is 120.335 emu/cm$^3$ at H=0 and the intrinsic coercivity $H_{ci}$ is −7779.15 Oe at M=0. Then, the remanent induction $B_r$ can be calculated by multiplying $4\pi$ to $M_r$ in CGS units, which gives us 1512.17 Gs (1 emu/cm3=1 Gs), and as the flexible magnet is "soft" magnet, the coercivity $H_c$ of the magnet was considered to be approximately equal to the intrinsic coercivity $H_{ci}$.

T is relevant to the sensor's sensitivity and the measurement range. In particular, when the magnetic period T increases, the sensitivity of the sensor increases and the measurement range decreases. To balance the measurement range and the sensitivity along both normal and shear directions, the magnetic period may be set as T=6 mm (i.e., the wavenumber k is 2π/T=1.04), which is an integer value (for ease of magnetization with the ready-made machine) between the balance period $T_1$=5.81 mm for the normal force and $T_2$=6.24 mm for the shear force (details can be found in FIG. 8). After determining the parameters of the flexible magnet, the elastomer thickness h and thereby the relative position between the flexible magnet and the Hall sensor may be set.

Figure 8:
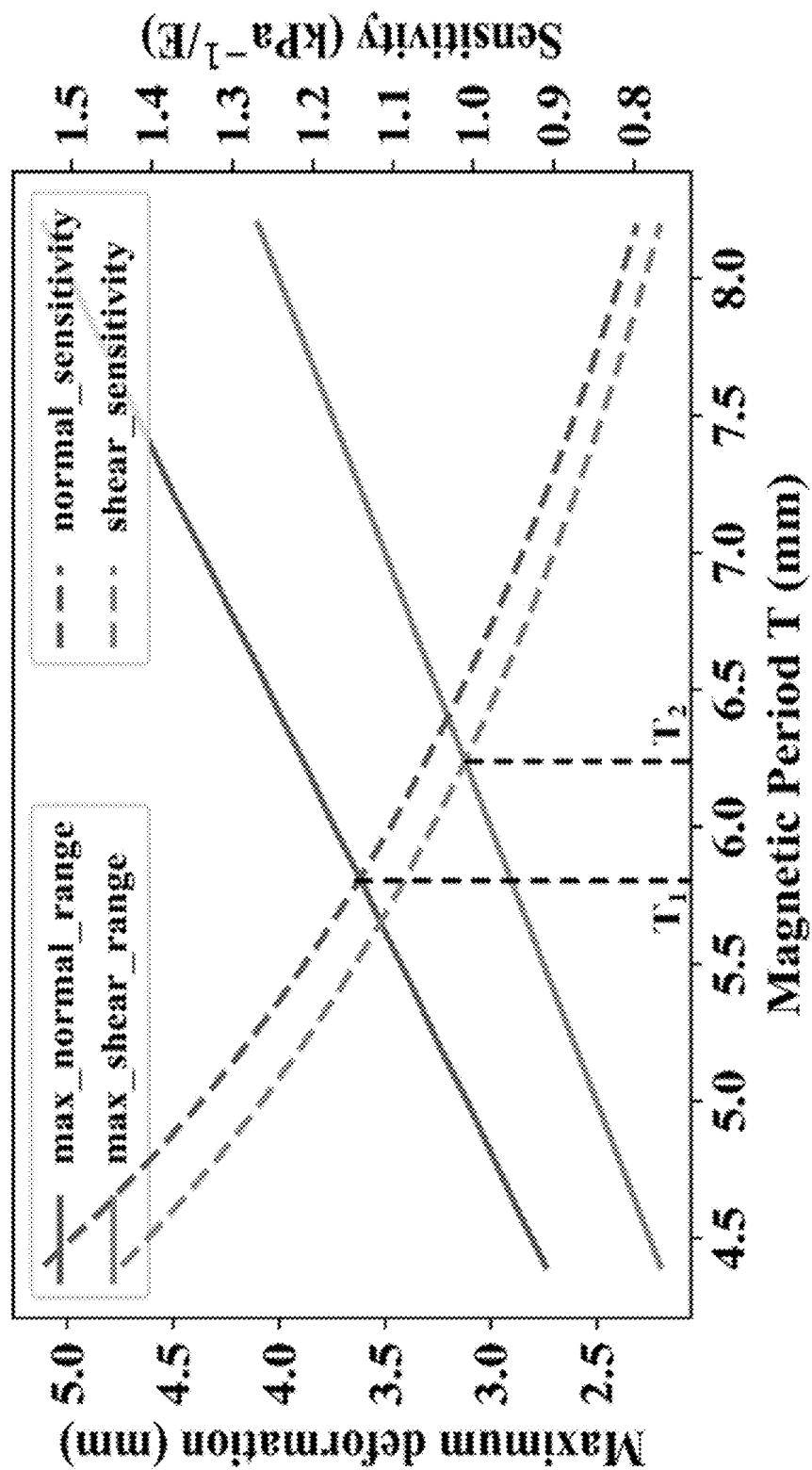
FIG. 8 is a plot showing a relationship between the magnetic period and the sensing range and sensitivity of the tactile sensor.

With reference to FIG. 8, the maximum sensing range of normal force depends on the maximum allowable deformation of the sensor in the normal direction, which is equal to the maximum elastomer thickness h. Here the maximum thickness h is defined by the distance away from the bottom surface of the magnetic film to the place where the attenuation of the magnetic strength is 98% of the maximum magnetic strength. The maximum sensing range of the shear force is defined as the half period (T/2) of the magnetic field according to $R_B$=tan(2π/T·x), where T is the period of $R_B$. The sensitivity of normal force is defined as $S_1$=Δ(ΔB %)/ΔP=$e^{(k \cdot \Delta z - 1)}$/($E_z \cdot \Delta z$) where k is the wavenumber (equals 2π/T), Δz is the deformation in the normal direction and $E_z$ is the elastic modulus of the elastomer layer in the normal direction. The sensitivity of the shear force is defined as $S_2$=Δ(Δ$R_B$ %)/ΔP=tan(k·Δx)/($E_x$·Δx) where Δx is the deformation in the shear direction and $E_x$ is the elastic modulus of the elastomer layer in the shear direction (suppose $E_x$=$E_z$=E). Here the Δz and Δx are 0.1 mm and the $S_1$ and $S_2$ are the sensitivities of the sensor at the initial deformation stage. $T_1$ and $T_2$ are magnetic periods that can balance the sensing range and sensitivity of the sensor for normal force and shear force, respectively. And to balance the sensor performance in normal and shear directions, the magnetic period was chosen as T=6 mm that is an integer value (for ease of magnetization with a ready-made machine) between $T_1$ (5.81 mm) and $T_2$ (6.24 mm) as shown in FIG. 8.

Figure 1D:
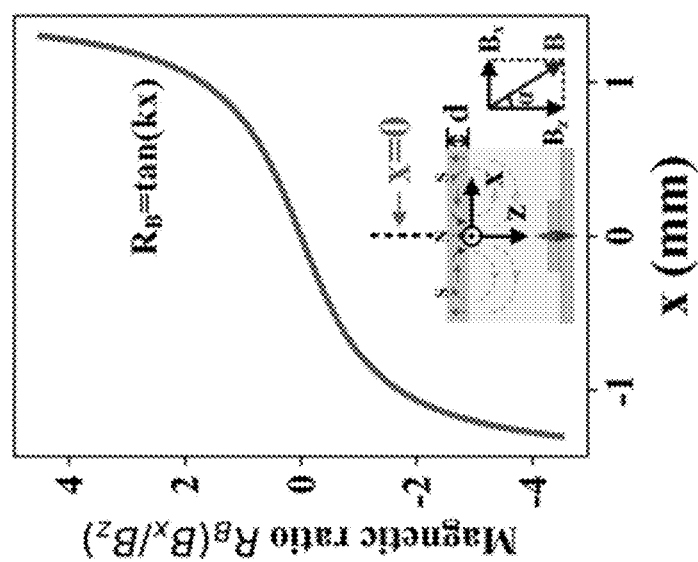
FIG. 1D is a plot showing the magnetic ratio ($R_B$) curve of the flexible magnet along the x-axis.
Figure 1C:
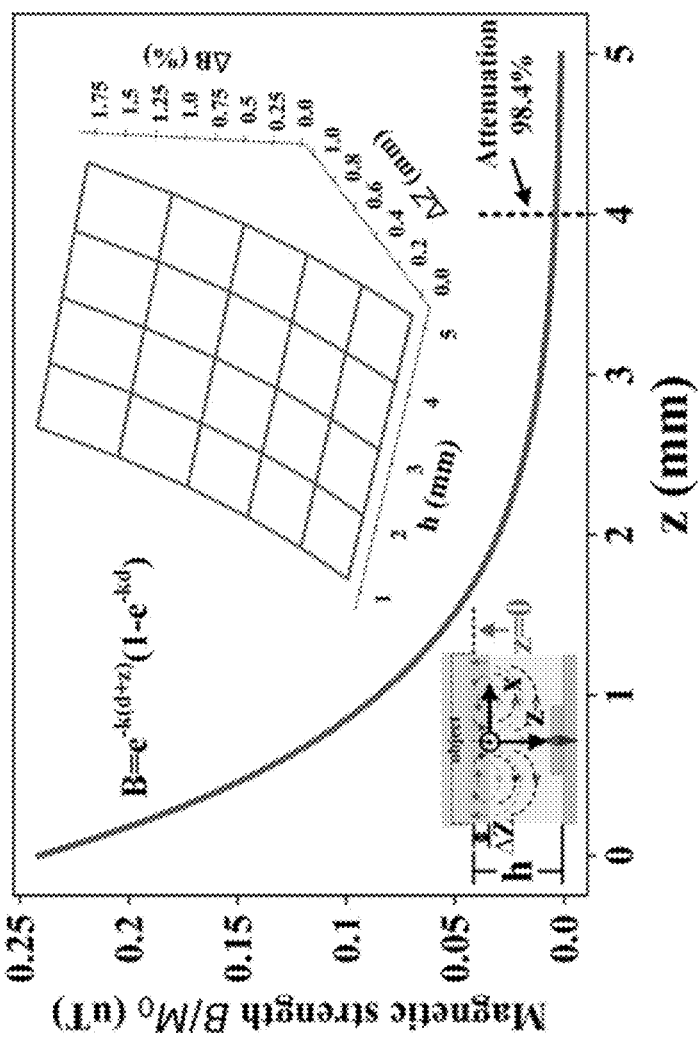
FIG. 1C is a plot showing the magnetic strength curve of the flexible magnet along the z-axis where the inset is the magnetic strength change (ΔB %) under the displacement load along the z-axis (ΔZ) with different elastomer thickness h.

FIG. 1C shows the magnetic strength curve of the flexible magnet along the z-axis, indicating the magnetic strength B decreases rapidly when leaving the bottom surface of the magnet. Specifically, the attenuation of the magnetic strength B, compared to the magnetic strength $B_{max}$ at z=0 mm, is 95%, 98% and 99% at z=2.9 mm, z=3.8 mm and z=4.5 mm, respectively. Hence, h is chosen within 3.8 mm where B≥0.02$B_{max}$ to ensure the magnetic flux density signals are valid and detectable to the sensor. It is also illustrated the magnetic strength change (ΔB %) under the displacement load along the z-axis (ΔZ) with different elastomer thickness h, where ΔB % is defined as:

$$\Delta B(\%) = \left| \frac{B - B_0}{B_0} \right| \times 100\% \quad (2)$$

Here, B and $B_0$ are magnetic strength sensed by the Hall sensor with and without the external force. The sensitivity can be thereby represented as S=Δ(ΔB %)/ΔP, where the pressure change ΔP=E·(ΔZ/h) and E is the elastic module of the silicone. It can be found that ΔB % does not change with different h, suggesting that the sensitivity is directly proportional to h. With this feature, a larger h may be chosen for a larger measurement range as well as a better sensitivity.

The above analysis verifies that the sensitivity and measurement range of the sensor can be designed on purpose to meet the requirement of diverse real-world applications by adjusting the elastic modulus E (for sensitivity) and/or the elastomer thickness h (for measurement range) accordingly. Preferably, h=3.5 mm, E=83 kPa may be chosen to obtain the largest measurement range as well as a sensitivity of 0.01 $kPa^{-1}$ (P≤120 kPa) for the normal force and 0.1 $kPa^{-1}$ (P≤10 kPa) to 0.27 $kPa^{-1}$ (10 kPa<P≤16 kPa) for the shear force with the response time ~15 ms (FIGS. S3 and S4). Such a high sensitivity in the shear direction may be important for detecting subtle shear forces and preventing slippage in applications like grasping and manipulation.

Figure 9B:
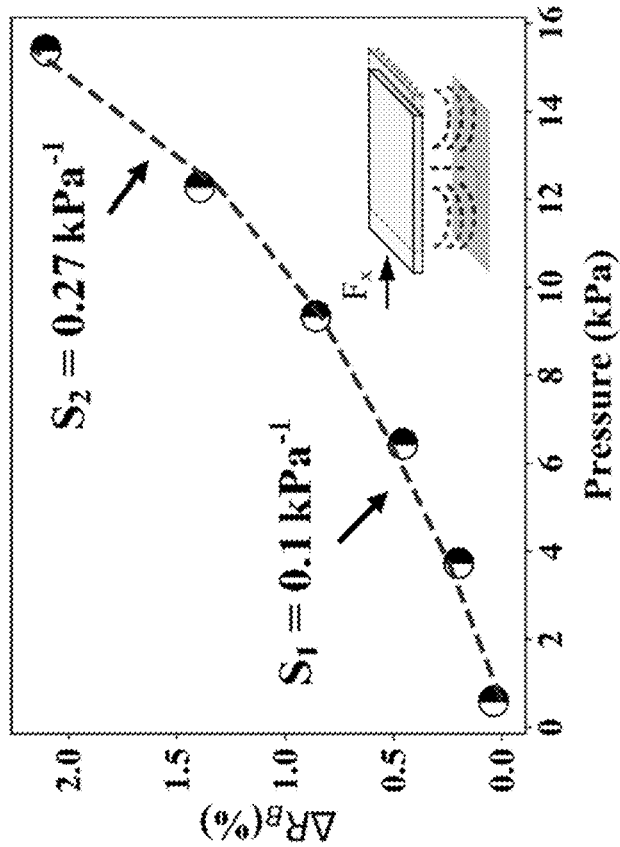
FIGS. 9A and 9B are plots showing sensitivities of the sensor for the normal and shear forces respectively.
Figure 9A:
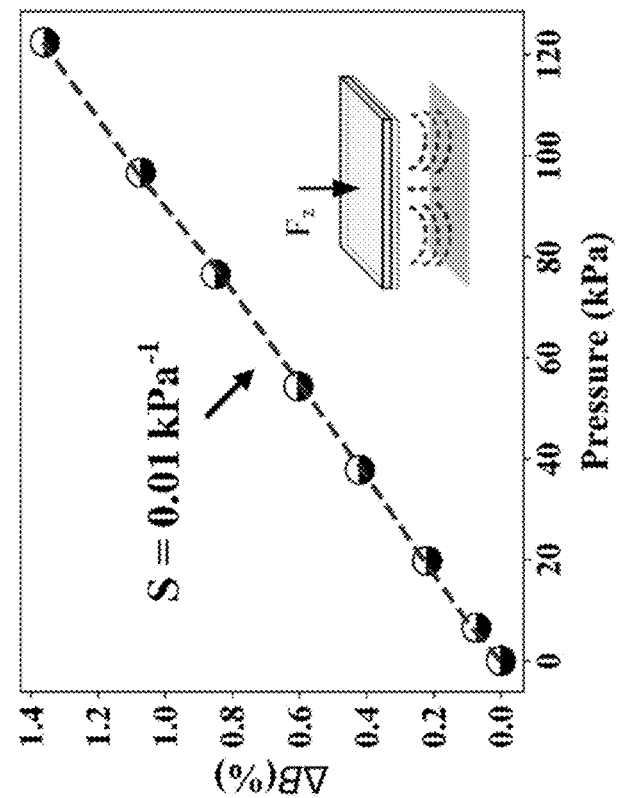

With reference to FIGS. 9A and 9B, the sensitivity is 0.01 $kPa^{-1}$ (P≤120 kPa) for the normal force and 0.1 $kPa^{-1}$ (P≤10 kPa) to 0.27 $kPa^{-1}$ (10 kPa<P≤16 kPa) for the shear force. However, the sensitivities in both the normal and shear directions can be adjusted to accommodate different applications by designing the sensor parameters.

Preferably, the sensitivity and measurement range of the sensor can also be tuned at the very beginning of the sensor designing stage, i.e., by adjusting the parameters of the first layer (d and T), to match the requirement of different working scenarios of the robot (e.g., requiring the measurements of large forces with a low sensitivity or subtle forces with high sensitivity).

In addition, the centers of the Hall sensor and the magnetic pole may be aligned to obtain a symmetric measurement range of the shear force (as showing by the symmetric magnetic ratio $R_B$ curve in FIG. 1D. For applications that only involve the shear force along one direction, the centers of the magnetic pole and the Hall sensor can be designed to be misaligned to increase the measurement range.

Moreover, besides working as a single taxel as described above, the tactile sensor can be easily extended to the form of sensor arrays (e.g., a 3×3 array in FIG. 1A) with multiple taxels, and such property is essential for tactile super-resolution and applications that require sensor scalability and large sensing areas. For example, the electromechanical sensor (array) may be applied for sensing an object or a tactile input, which may involve tracking a motion of an object corresponding to external forces applied on the flexible film by the object during a predetermined period of time, by processing a magnetic flux density of multiple neighbouring taxels in the magnetic sensor around the position of the pressing force applied to the flexible film.

The sensor may be calibrated on a manual 3-axis moving platform. The 3D-printed indenters were used to apply the displacement loads, and the ATI Nano 17 6-axis F/T sensor (ATI Industrial Automation, Apex, N.C., USA) was used as the ground truth of the displacement loads.

To validate the self-decoupling property of the sensor, 7×7 combinations of displacement loads were applied within seven rounds. Specifically, a constant displacement load along the normal direction (Δ$Z_1$) was first applied on the sensor by a 3D-printed indenter of a square shape, and then a successive of displacement loads along the tangential direction (from Δ$X_1$ to Δ$X_7$) were applied with an increment step size of 0.25 mm. In the next round, the constant displacement load along the normal direction was increased to Δ$Z_2$ with a step size of 0.25 mm, and the tangential displacement loads were then applied in the same way as in the first round (from Δ$X_1$ to Δ$X_7$). Repeat this procedure until the normal displacement load was increased to Δ$Z_7$ so that the response of the sensor under 7×7 combinations of displacement loads were collected (FIG. 2G-K).

The flexible magnet (18 mm×18 mm) was sampled at 0.2 mm spacing in both the x and y directions, generating 8100 sampling points (90×90) in total. Then, the 3D-printed indenter of a spherical head (8 mm diameter) was pressed at each sampling point with five indentation depth (from 0.2 mm to 1 mm), which produced 40,500 sets of data for training the neural networks, where each set of the data includes three magnetic flux densities ($B_x$, $B_y$, and $B_z$) of nine taxels, i.e., 27 magnetic flux densities for each set of the data.

Preferably, the method of sensing object or tactile input comprises the steps of receiving a detection signal provided by the magnetic sensor in the electromechanical sensor, wherein the detection signal is generated in response to a movement of the magnetic element on the flexible film, decoupling the external force to a shear force component and a normal force component in terms of a magnetic ratio $R_B$ and a magnetic strength B of the magnetic flux sense by the magnetic sensor; determining the shear force and the normal force applied to the flexible film. In particular, the detection signal may be obtained by measuring the output from the hall sensors in different positions on the base, therefore processing the detection signal may allow determining a position and/or a depth of a pressing force applied to the flexible film relative to the base.

Figure 2A:
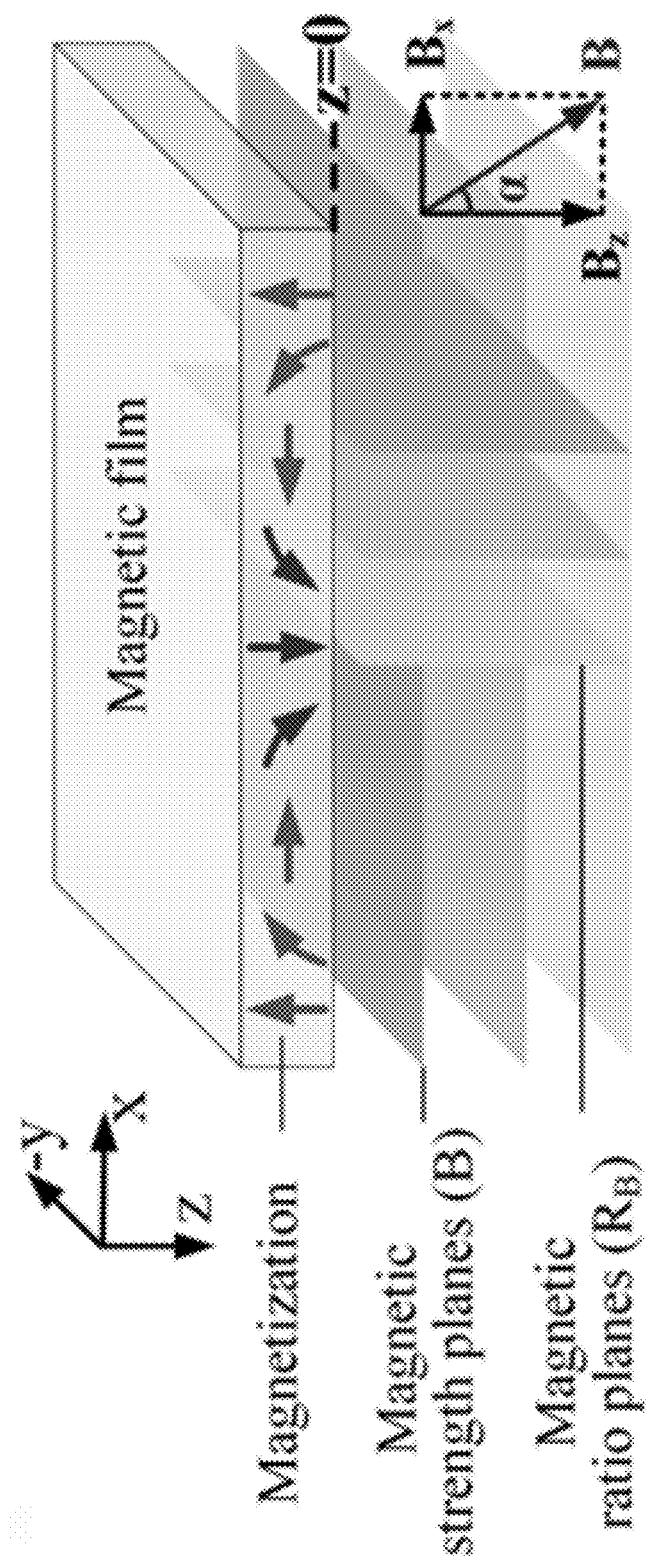
FIG. 2A is an illustration of the magnetic strength planes and magnetic ratio planes (the ratio of $B_x$ and $B_z$) under the bottom surface of a sinusoidally magnetized magnet film used in the electromechanical sensor.

The sensor's self-decoupling ability is enabled by a proper design of the magnetization direction in the flexible magnet film (i.e., the top layer). With reference to FIG. 2A, the flexible film is magnetized in a sinusoidal pattern, resulting in a magnetic field distribution under the film that has two self-decoupled components in terms of the magnetic strength B and the magnetic ratio $R_B$ as described by Eq. (1).

Figure 2B:
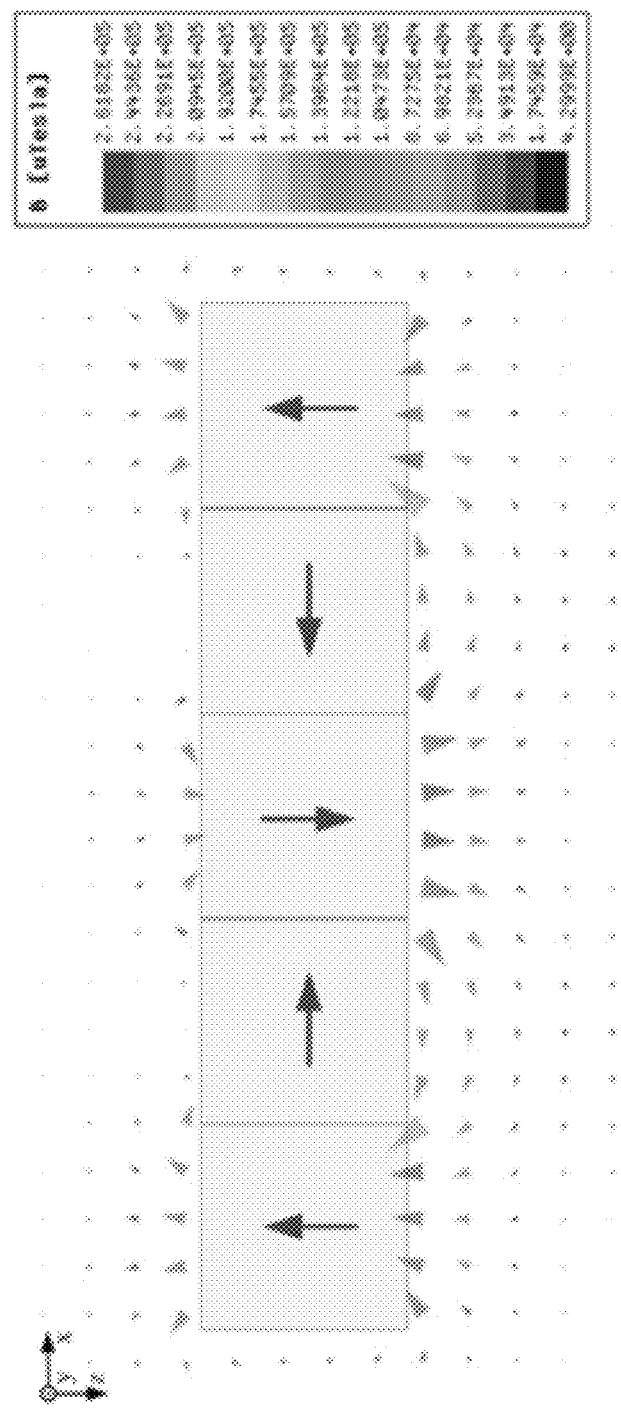
FIG. 2B is a color plot showing simulation results (in ANSYS Maxwell 3D) of the magnetic field under the magnet film, where the red arrows indicate the magnetization direction.

The overall magnetic flux density $B(x,z)$ is independent of the X coordinate and the magnetic ratio $R_B(x,z)$ is independent of the Z coordinate, indicating that $B(x,z)$ and $R_B(x,z)$ are inherently decoupled in the x-z plane, and their notations may be simplified as $B(z)$ and $R_B(x)$ in the following part. To verify and visualize the magnetic distribution under the flexible magnet, the simulation (by ANSYS Maxwell 3D) and the experimental results are given in FIGS. 2B and 2C, respectively.

Figure 10:
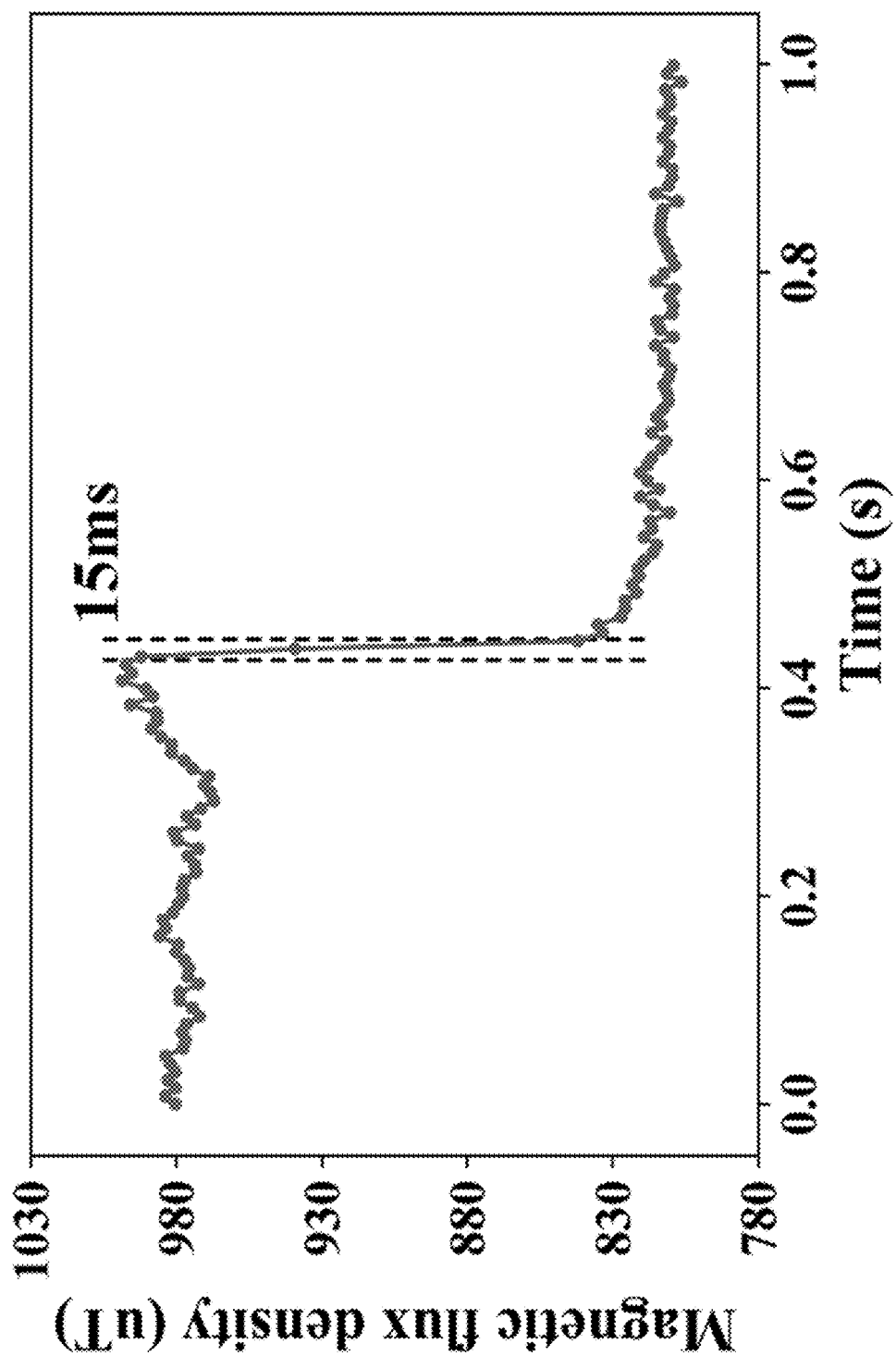
FIG. 10 is a plot showing an instant response time of the sensor (15 ms).

With reference also to FIG. 10, the response time of the sensor is measured by calculating the dropping time of the sensor signals when the external load is quickly removed from the sensor. Here the sensor signal's sampling rate is 130 Hz.

Figure 11:
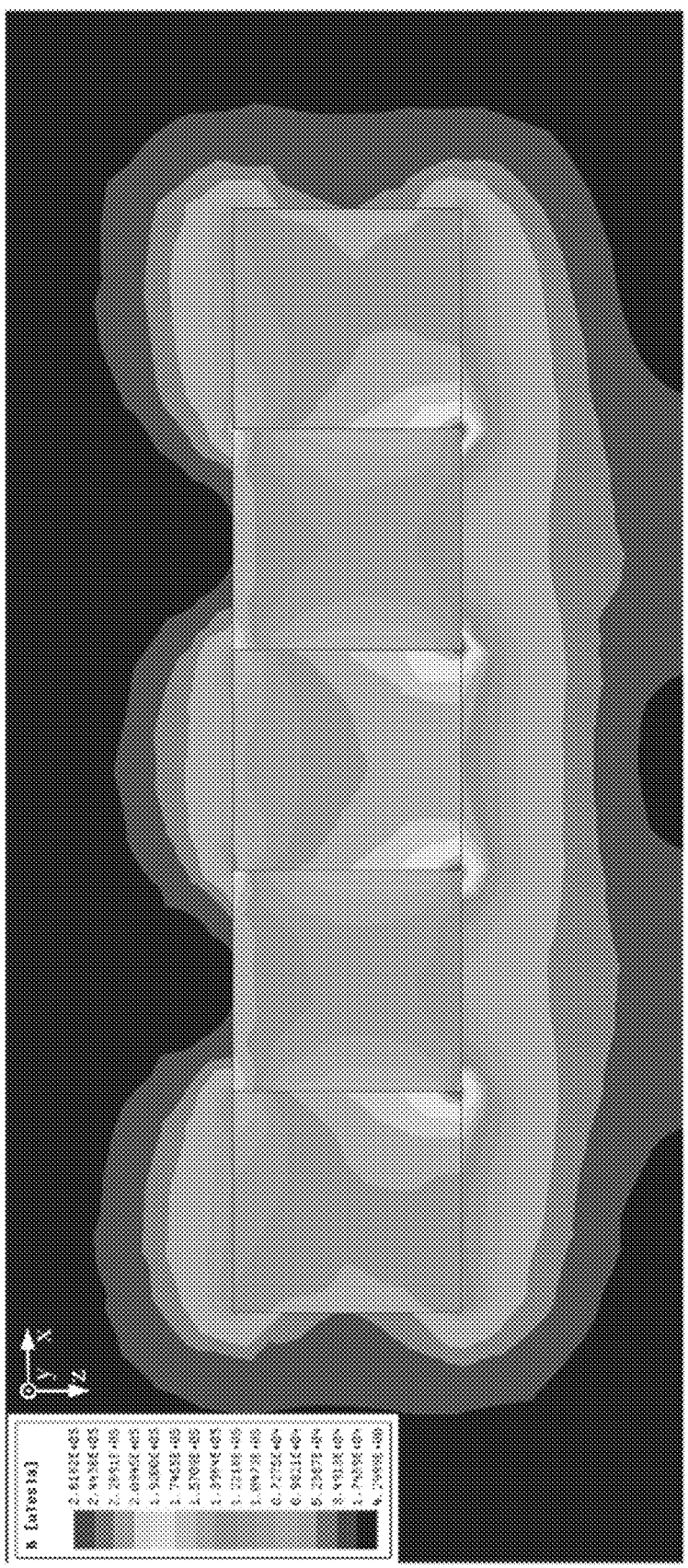
FIG. 11 is a color plot showing the simulation result of the magnetic flux density distribution of the flexible magnet.

With reference to FIG. 11, the simulation result (in ANSYS Maxwell 19.1) of the magnetic flux density distribution of the flexible magnet is shown, where the remanent induction $B_r$ was set to 1512.17 Gs and the coercivity $H_c$ was set to −7779.15 Oe in the simulation environment as derived in FIG. 7.

Figures 2C, 2D, 2E:
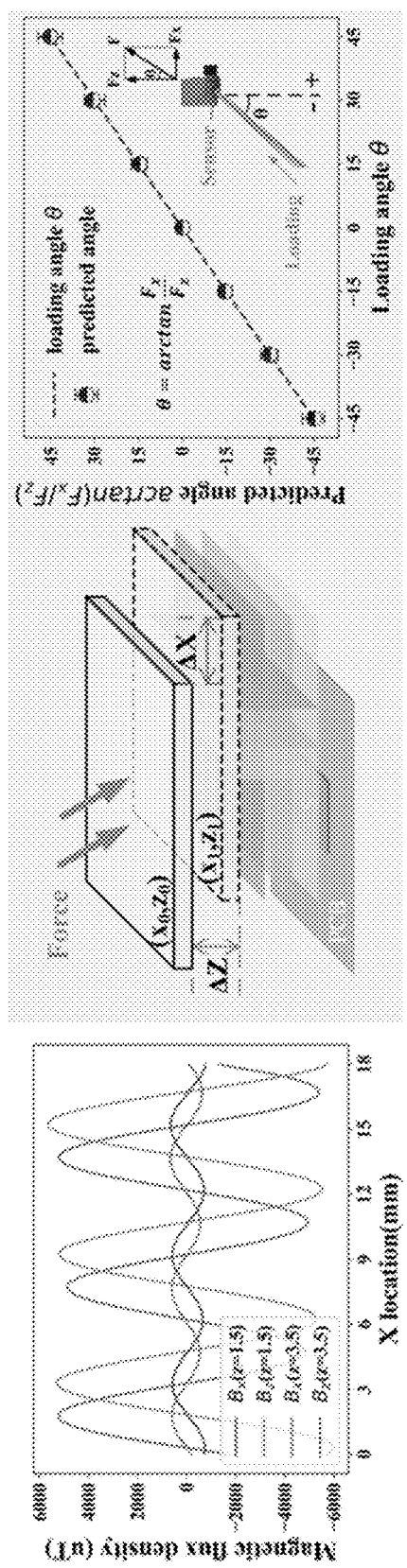
FIG. 2C is a plot showing experimental measurements of the magnetic distribution under the magnet film along the x-axis, where z=1.5 (or 3.5) indicates that the measurement plane is 1.5 mm (or 3.5 mm) away from the bottom surface of the magnet film.
FIG. 2D is an illustration of the deformation of a sensing unit under the full-contact loading, where ΔX and ΔZ denote the displacements along the x and z directions.
FIG. 2E is a plot showing the predicted loading angles (derived from the outputs of the normal force $F_z$ and the shear force $F_x$) versus the actual angles of the loading that is applied by a glass stick.

Further referring to FIGS. 2D and 2E, when the flexible magnet film is deformed from the position $(x_0,z_0)$ to $(x_1,z_1)$ under an external force F, the relationship between the force components and the change of magnetic signals can be derived as:

$$\begin{bmatrix} F_z \\ F_x \end{bmatrix} = \begin{bmatrix} \dfrac{c_1 SE}{kh} \ln \dfrac{B(z_1)}{B(z_0)} + b_1 \\ \dfrac{c_2 SG}{kh} \arctan R_B(x_1) + b_2 \end{bmatrix} \quad (3)$$

where S is the contact area, E, G and h are the elastic modulus, the shear modulus, and the thickness of the elastomer layer, respectively. $c_1$ and $c_2$ are the compensation coefficients for the elastic modulus and the shear modulus. $b_1$ and $b_2$ are bias coefficients to ease the calibration of the sensor in different applications. For isotropic elastic materials, the shear modulus satisfies $G=E/(2(1+V))$, where V is the Poisson's ratio of the material (~0.5 for the elastomer layer). Eq. (3) indicates that the normal force output $F_z$ only depends on the magnetic strength B, and the shear force output $F_x$ is only dependent on the magnetic ratio $R_B$. Since B and $R_B$ are independent of each other, this theoretically verifies that the normal and the shear forces outputted by the sensor are decoupled.

Figures 2F, 2G, 2H:
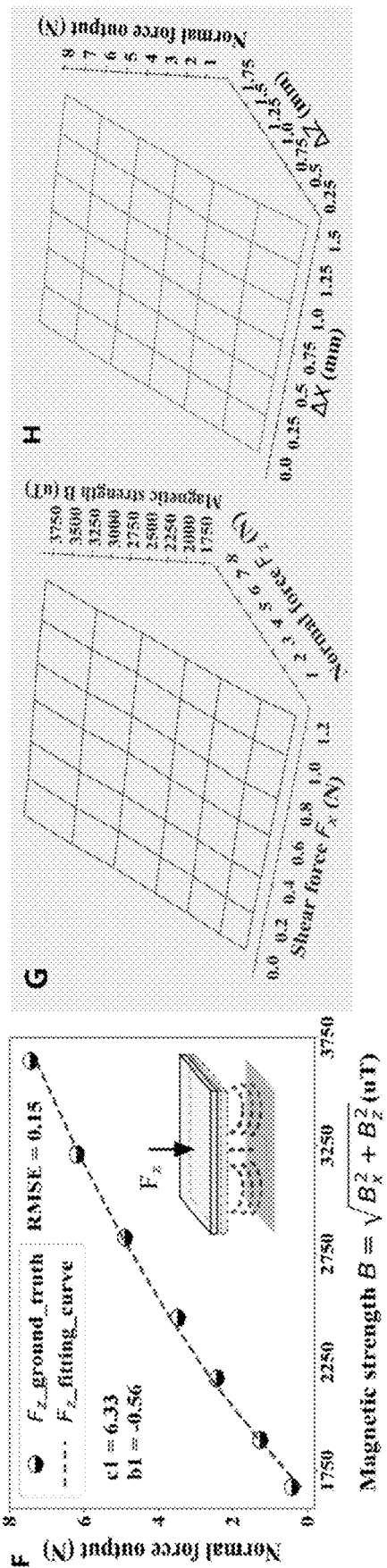
FIG. 2F is a plot showing a relationship between the normal force output and the magnetic strength measurement B under the normal load $F_z$, where $c_1$ and $b_1$ are parameters of the curve for $F_z$ fitted with Eq. 3.
FIG. 2G is a plot showing the magnetic strength B under both the shear and normal forces. The plot shows that B increases as $F_z$ increases but remains constant at different $F_x$, which suggests that the change of magnetic strength is independent of the shear load.
FIG. 2H is a plot showing the normal force output under displacement loads of both ΔX and ΔZ, where the normal force increases only when ΔZ increases, which suggests that the predicted normal force is independent of the shear load.

The self-decoupled property was also verified experimentally. FIG. 2F illustrates the relationship between the normal force output $F_z$ and the magnetic strength B. Data from the experiment match the Eq. (3), with the root mean squared error (RMSE) between the theoretical and measured forces being only 0.15N.

Moreover, with reference to FIGS. 2G and 2H, the magnetic strength B (or the normal force output) increases as the normal load $F_z$ (or $\Delta Z$) increases, but it remains constant when the shear load $F_x$ (or $\Delta X$) grows. This implies that the measurement of the normal force is independent of the shear load.

Figures 2I, 2J, 2K:
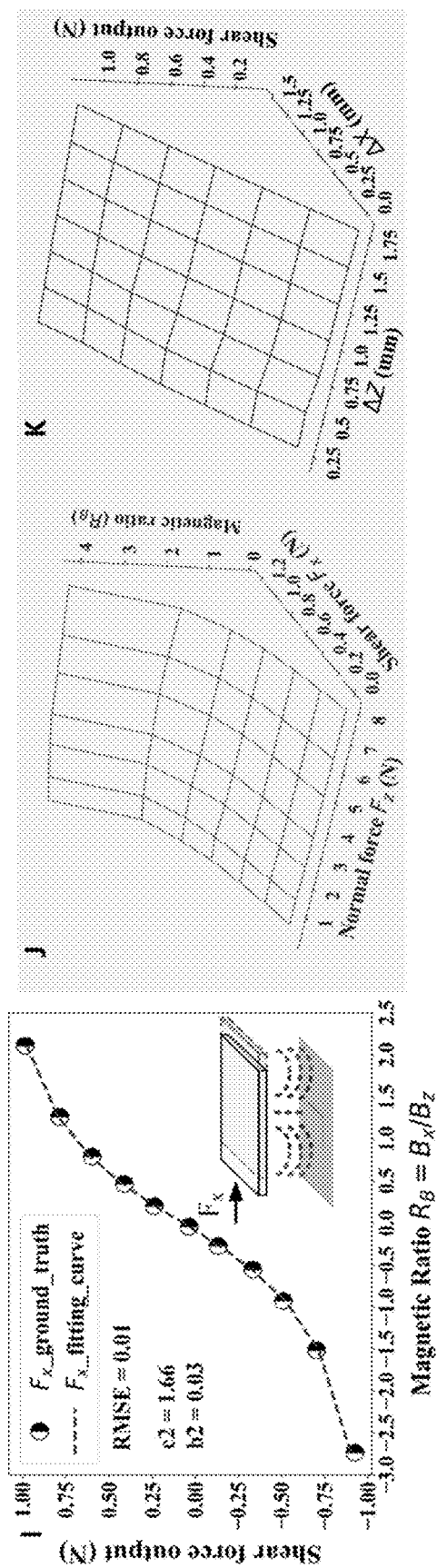
FIG. 2I is a plot showing a relationship between the shear force and the magnetic ratio measurement $R_B$ under the load along the x direction, where $c_2$ and $b_2$ are parameters of the curve for $F_x$ fitted with Eq. 3.
FIG. 2J is a plot showing the magnetic ratio $R_B$ under loads of both $F_x$ and $F_z$.
FIG. 2K is a plot showing the predicted shear force under both ΔX and ΔZ.
Figure 12:
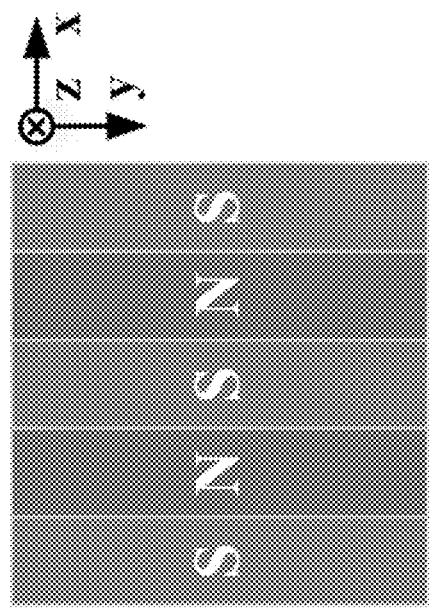
FIG. 12 is an illustration showing a relationship between the magnetization pattern of the flexible magnet and the corresponding force decoupling ability of the sensor.
Figure 12:
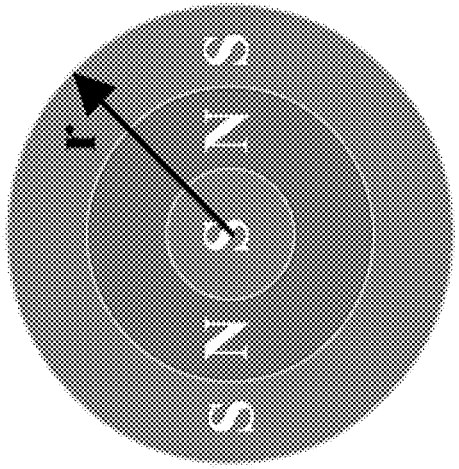

Similarly, with reference to Figures corresponding results were obtained for the shear force output $F_x$ in FIGS. 2I, 2J and 2K. These results reveal that the measurements of the normal and shear forces are independent of each other. In this experiment, only the force decoupling ability of the sensor in 2-axis (x-z) is demonstrated. However, it can be theoretically extended to 3-axis (x-y-z) by designing an appropriate magnetization pattern of the flexible magnet, referring to FIG. 12.

In this example, the force decoupling ability of the sensor can be designed by adjusting the magnetization pattern of the flexible magnet. In the examples described in this disclosure, the flexible magnet is magnetized in a stripe-like manner as shown in the left side of FIG. 12, which results a 2-axis (x-z) force decoupling ability since the magnetization strength in y-axis is zero. However, the force decoupling ability of the sensor can be theoretically extended to 3-axis (x-y-z) by magnetizing the flexible magnet in a concentric rings-like manner as shown on the right side the figure, where the magnetization is in both radial (can be decomposed to x and y axes) and z-axis directions.

To conclude, compared with the traditional tactile sensors that are either mechanically decoupled (using multiple sensing units) or decoupled by data-fitting methods (using complicated models), the electromechanical sensor is able to measure both the normal and shear forces in a decoupled way with a simpler sensor structure and more time-saving fabrication and calibration processes.

Preferably, the detection signal processing may include referencing to a pre-calibrated lookup table to match the pre-calibrated records against the measurements. For example, by measuring a magnetic flux density at the position of the pressing force applied to the flexible film, the depth of the pressing force may be determined. Alternatively, it is possible to measure the depth at the position of the pressing force applied to the flexible film so as to determine a force magnitude of the pressing force. Optionally or additionally, the processing the detection signal may further include estimating coordinates of the position of the pressing force applied to the flexible film using a neural network.

Figures 3A, 3B:
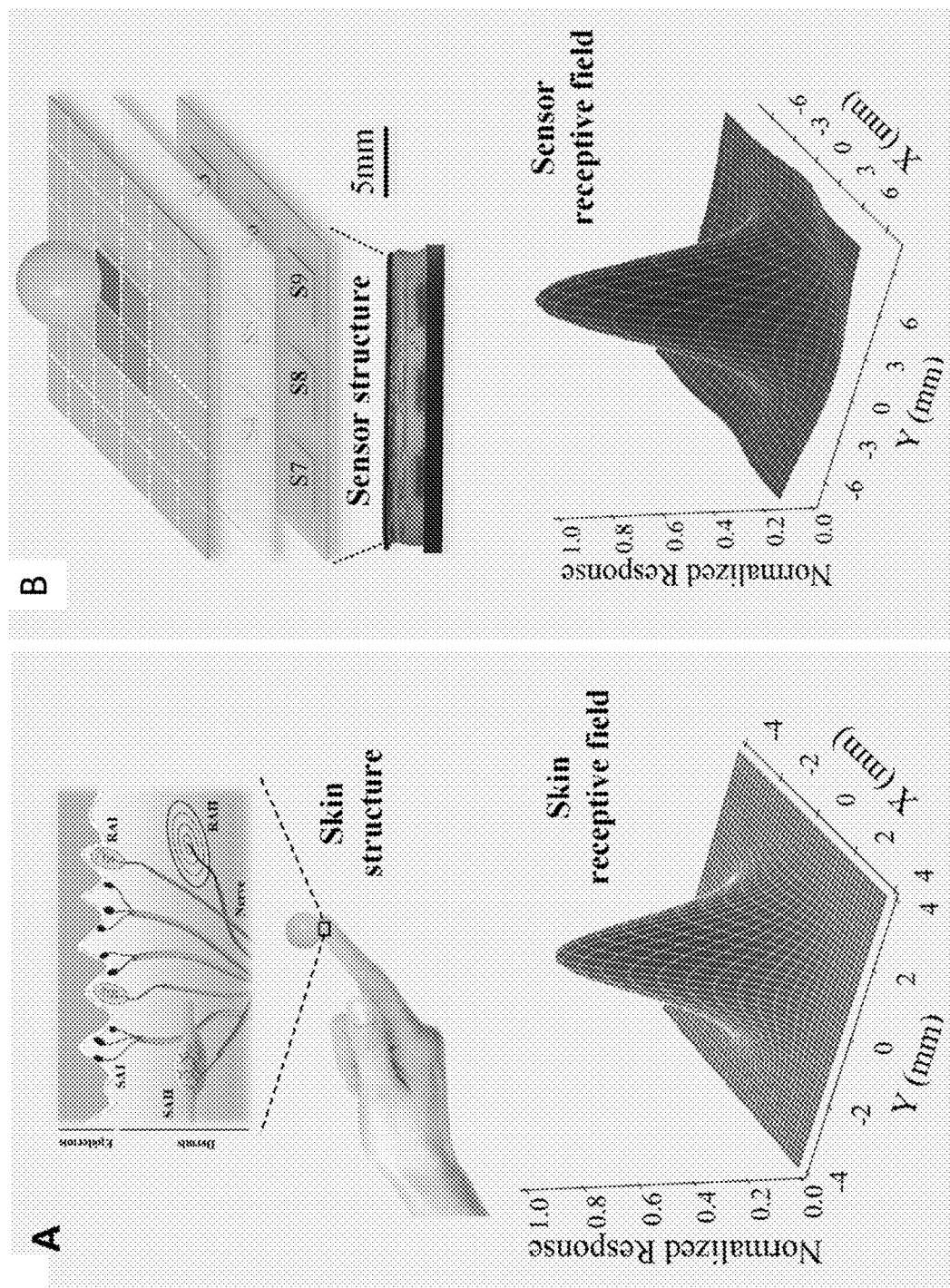
FIG. 3A is an illustration of the skin structure of the human finger, with the receptive field of a single SA1 afferent in the fingerpad shown below.
FIG. 3B is an illustration showing a modified version of the tactile sensor of FIG. 1A, where the discrete magnet films in a 3×3 array are replaced with a continuous magnet sheet mimicking the human skin, and the receptive field of a single taxel of the sensor, which is similar to that of the human skin is shown below.

For comparing the responses to external loadings of our sensor and the human skin, the 3×3 Hall sensor array is covered by a continuous magnet sheet analogous to the continuous structure of human skin. With reference to FIGS. 3A and 3B, the electromechanical sensor exhibits high similarity to the human skin in the receptive fields, which thereby leads to similar responses to the external load as shown in FIGS. 3C and 3D.

In particular, the responses of both the human skin (in terms of the impulse frequency) and the tactile sensor (in terms of the magnetic flux density $B_z$) reach the peak when a spherical object contacts the sensor's hot spot (i.e., the location with the maximum sensitivity) and decrease as the contact shifts away from the hot spot. Taking the indentation depth of 200 μm for example, as the contact shifts away from the hot spot by 3 mm, the impulse frequency of human skin decreases from 70 Hz to ~0 Hz, and the sensor response ($B_z$) drops from 318 mT to ~0 mT. At the same time, the responses get weakened for both the human skin (from 138 Hz to 20 Hz) and the tactile sensor (from 1067 mT to 318 mT) as the indentation depth decreases from 500 μm to 200 μm at the hot spot.

Similar to the biological hyperacuity of humans, the artificial tactile super-resolution is a technique that leverages overlapping receptive fields of neighboring taxels to perceive stimuli details better than the sensor's physical resolution. In contrast to some other example tactile sensor arrays, in which the physical resolution is usually rough due to the low taxel density, but a higher taxel density will lead to crowded wire connections, a longer time for data acquisition, and probably crosstalk effects. As an alternative choice, the tactile super-resolution may be applied to improve the sensor's spatial resolution without introducing a high density of taxels.

Figure 3E:
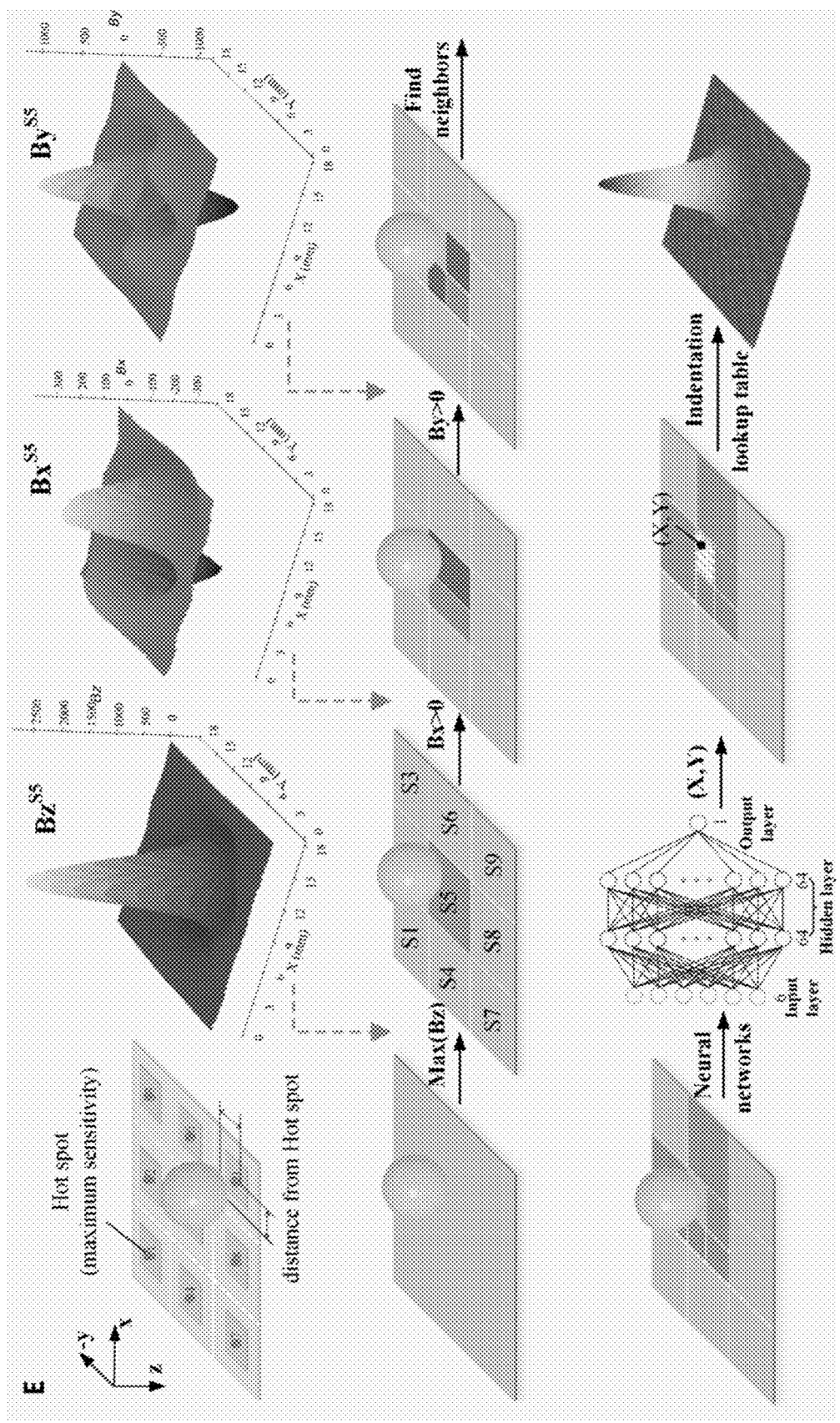
FIG. 3E is an illustration showing, in the top and the middle rows, a ball placed on the tactile sensor is firstly targeted on the taxel S5 since the magnetic flux density along the z direction of the taxel S5 ($B_z^{S5}$) is the largest among all taxels, then the contact position of the ball can be further narrowed down to the right side of the taxel according to the sign of $B_x^{S5}$ (here $B_x^{S5}>0$), similarly, the ball is localized to the upper side of the taxel since $B_y^{S5}>0$, which leads to a coarse estimation of the contact position in the upper right corner of taxel S5; and on the bottom row, (i) find two neighboring taxels of S5 (S6 in the x direction and S2 in the y direction), (ii) feed the corresponding magnetic flux densities as inputs into two neural networks for estimating the X coordinate and Y coordinate, respectively, and (iii) look up the indentation depth according to the contact position (X, Y) and the current readings of magnetic flux densities from the lookup tables, then find the magnitude of the normal force corresponding to the indentation depth from the lookup table.
Figure 13:
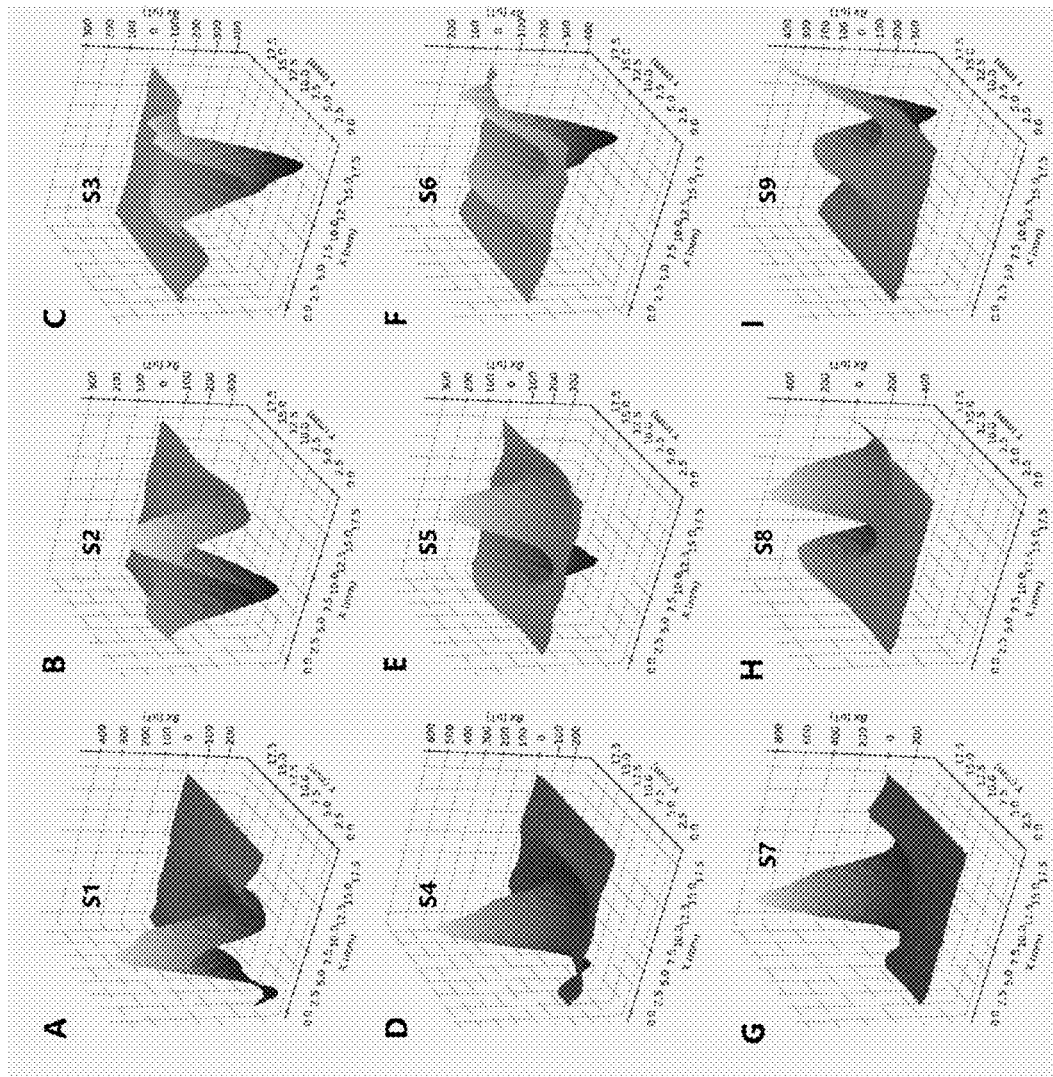
FIG. 13 is a series of plots showing receptive field (x directional response $B_x$) of all nine taxels.
Figure 14:
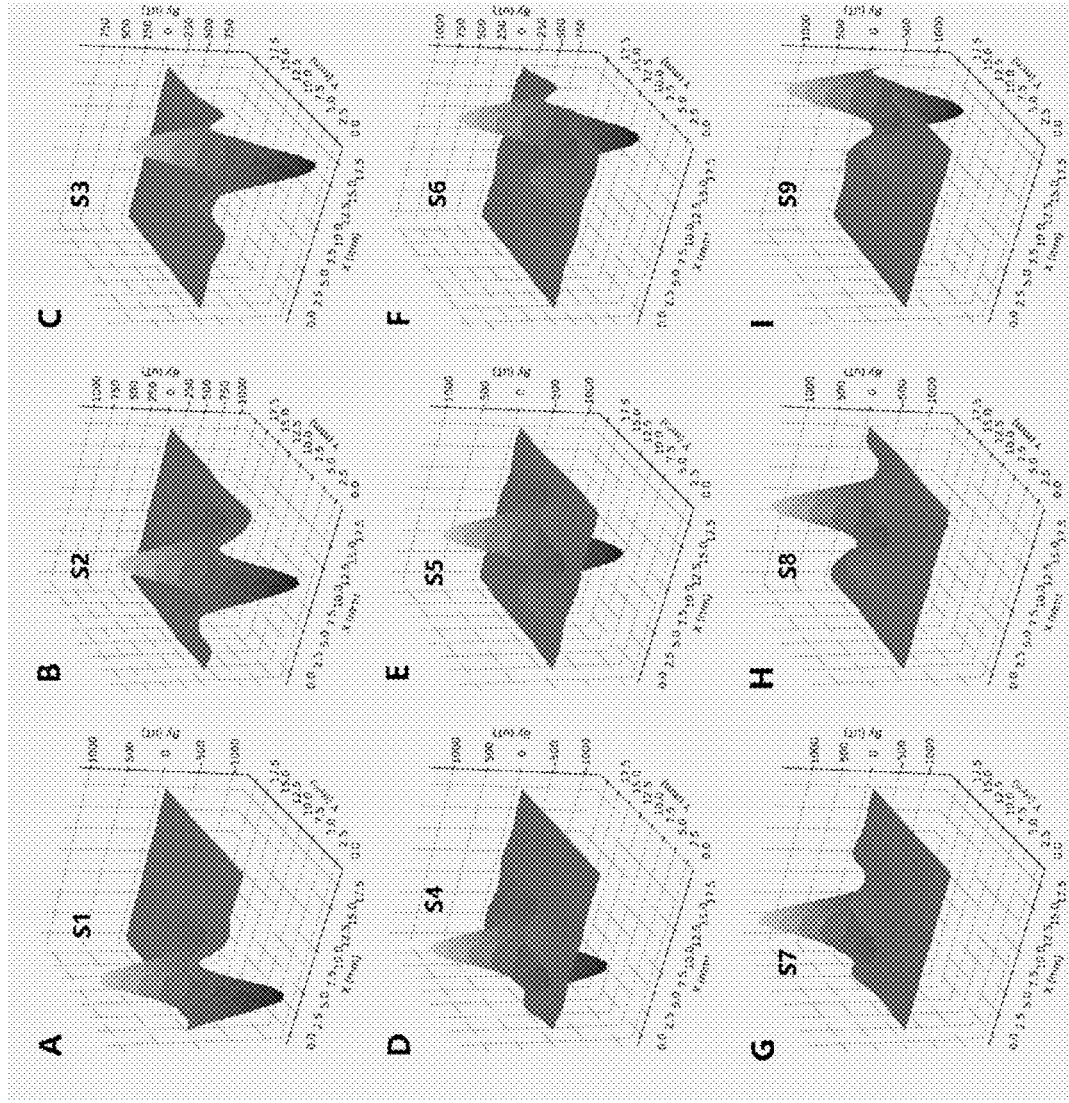
FIG. 14 is a series of plots showing receptive field (y directional response $B_y$) of all nine taxels.
Figure 15:
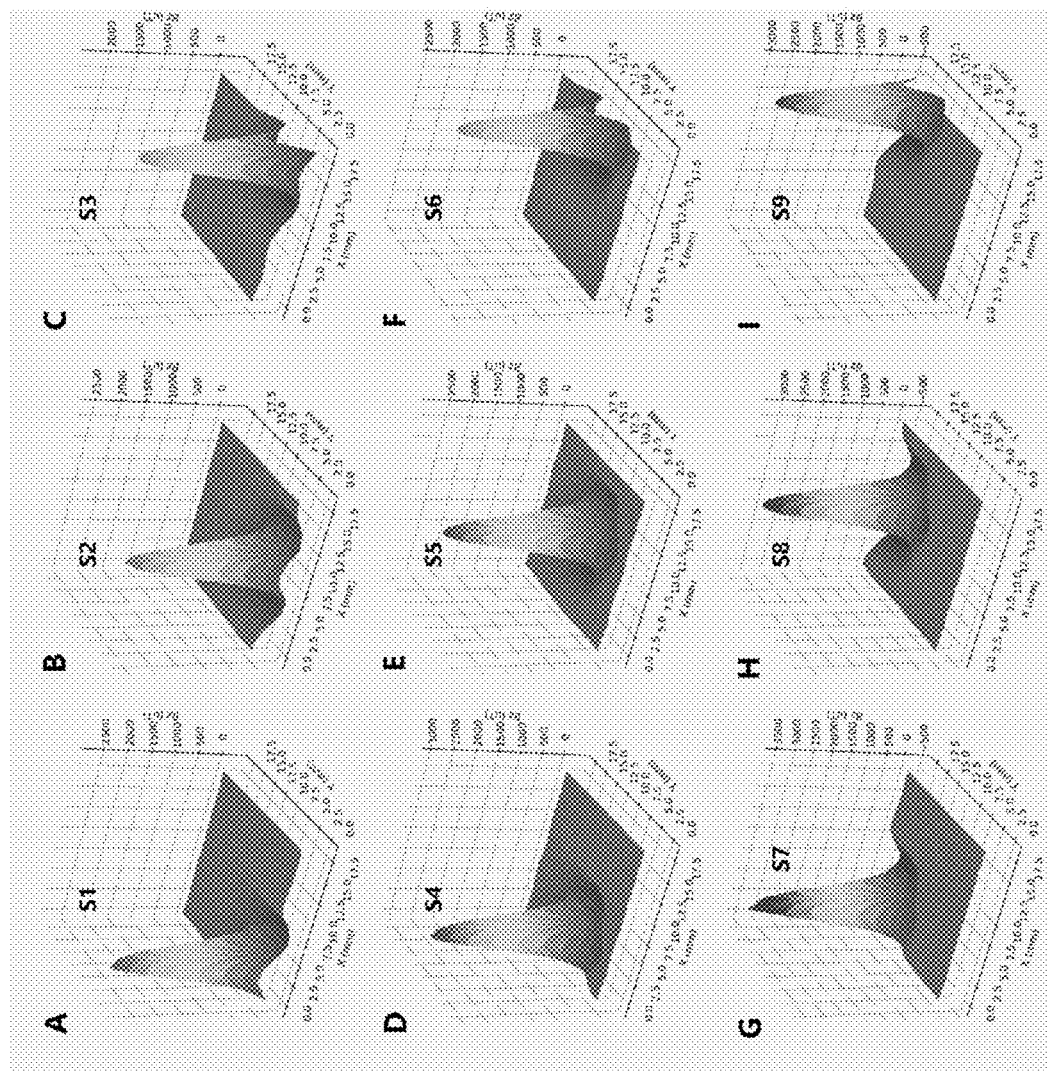
FIG. 15 is a series of plots showing receptive field (z directional response $B_z$) of all nine taxels.

With reference to FIG. 3E, when a ball contacts the sensor surface, the taxel (S5) that measures the largest magnetic flux density in the z direction ($B_z^{S5}$) is closest to the contact point (i.e., S5 is activated the most among nine taxels). Then the contact area will be further narrowed down to the upper right corner of the taxel S5 by merely checking the sign of the corresponding magnetic flux densities measured by the sensor, i.e., the $B_x$ reading ($B_x^{S5}>0$) and the $B_y$ reading ($B_y^{S5}>0$). Using above qualitative analyses, the localization accuracy can be improved by 2-fold (from 6 mm to 3 mm) without pre-calibration (FIGS. 13-15). Moreover, such a coarse localization method is insensitive to the object shape and the involvement of the shear force, which eases many practical applications such as the real-time position (or its motion) tracking of a rolling ball.

For the characterization of the super-resolution property, the flexible magnet (18 mm×18 mm) was sampled at 0.2 mm spacing in both x direction and y direction, resulting 8100 sampling points (90×90) in total. When the flexible magnet was pressed at each sampling point, the sensor responses of all nine taxels in three directions (x, y, and z) were measured as shown in FIG. 13, FIG. 14 and FIG. 15, respectively.

For estimating the accurate X and Y coordinates of the contact position, with reference to FIG. 3E, two neural networks with the same architecture may be employed. To be specific, inspired by the fact that human touch attains super-resolution based on the population responses of multiple mechanoreceptors, the responses of both the taxel S5 and its neighboring taxels (S6 in the x direction and S2 in the y direction) are considered as the inputs of the neural networks. Each neural network is composed of three layers (except for the input layer of 6 neurons), with 64 hidden units in each of the two hidden layers and one hidden unit in the output layer, and the activation function of each hidden neuron is the rectified linear unit (ReLU).

Figure 16:
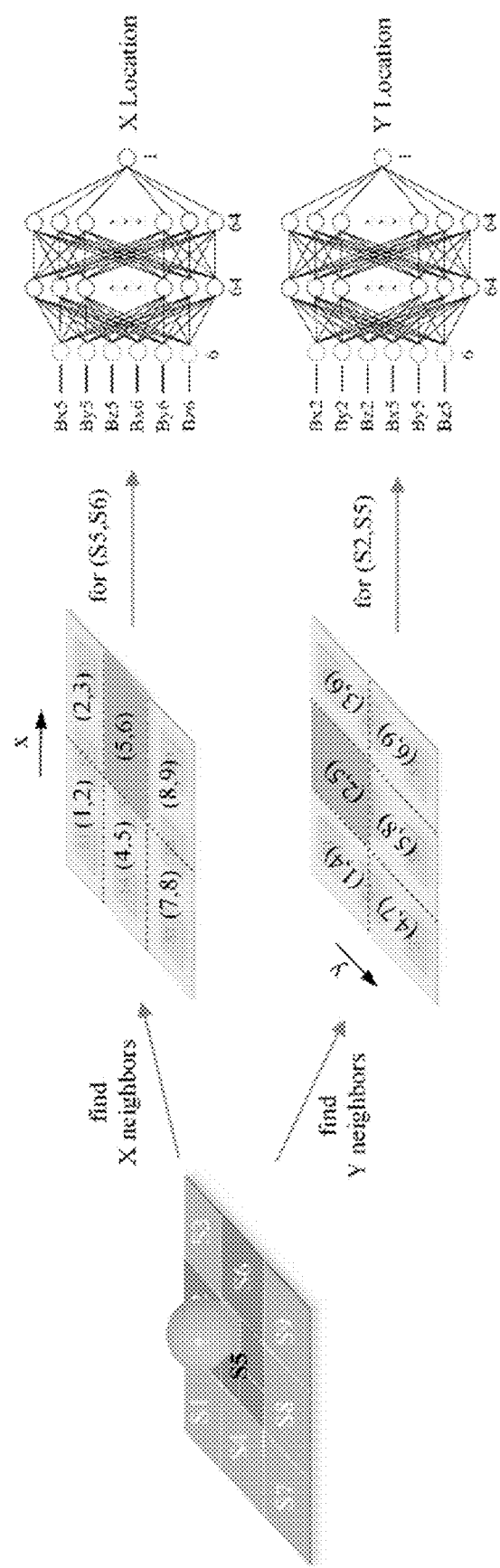
FIG. 16 is an illustration showing a localization procedure using tactile signals from two neighboring taxels.

The localization procedure can be found in FIG. 16. In this example, To precisely locate the contact position on taxel S5, two neural networks with the same structure are employed for estimating the accurate X location and Y location, respectively. The responses of both the taxel S5 and its neighboring taxels (S6 in x direction and S2 in y direction) are considered as inputs of the neural networks.

To investigate whether $B_y$ (or $B_x$) is beneficial to the localization accuracy in the x (or y) direction, comparing the X (or Y) localization accuracy in two cases: $B_y$ (or $B_x$) is unknown verses known. In the first case, the inputs are two neighboring taxels' magnetic flux densities $\{B_x, B_z\}$ for the X localization and $\{B_y, B_z\}$ for the Y localization; in the second case, the inputs are $\{B_x, B_y, B_z\}$ for both the X and Y localization.

With reference to FIG. 4A, the results show that the localization errors (in terms of the mean absolute error) for both X and Y coordinates are much smaller when using $\{B_x, B_y, B_z\}$ as inputs than using $\{B_x, B_z\}$ or $\{B_y, B_z\}$ as inputs, suggesting that $B_y$ (or $B_x$) contributes to the localization accuracy in the x (or y) direction. The five-fold cross-validation error is 0.09 mm for the X localization and 0.11 mm for the Y localization on average, which means the localization accuracy can be theoretically improved by ~60 folds from 6 mm (i.e., the physical resolution of the sensor) to around 0.1 mm. By contrast, the inputs of the neural networks were replaced by the magnetic flux densities of every individual taxel, and then the localization error increased as shown in FIG. 14. This suggests that taking into account the responses of two neighboring taxels indeed produces a higher localization accuracy than just considering a single taxel, which is in line with our previous assumptions, i.e., considering the population response of multiple sensing units can improve the localization accuracy.

Figure 17:
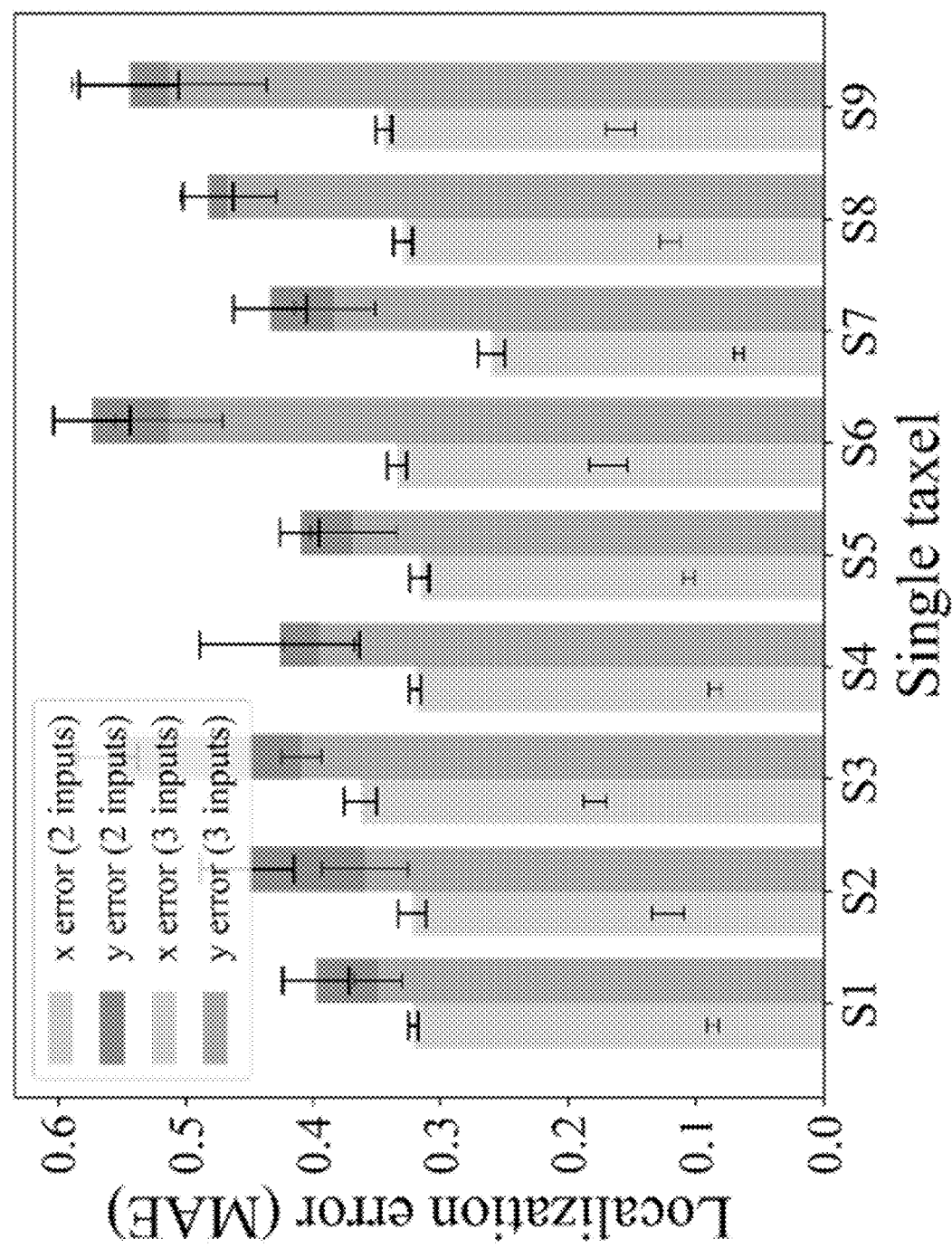
FIG. 17 is a chart showing a localization error when the inputs of the neural networks are responses of every individual taxel rather than two neighboring taxels.

With reference also to FIG. 17, for tactile super-resolution, when the inputs of the neural networks were replaced by the magnetic flux densities of every individual taxel, the localization error increased compared to that when considering the responses of neighboring taxels (FIG. 4A). Preferably, the best localization error is 0.09 mm for X location and 0.12 mm for Y location on average (6 inputs) when considering the responses of neighboring taxels, which are much smaller than that (0.12 mm for X location and 0.41 mm for Y location) with three inputs when just considering the response of every single taxel.

To validate the performance of the deep-learning enhanced super-resolution in real-world applications, referring to FIG. 4B, a spherical indenter (8 mm in diameter) may be used to press different locations of the sensor dot by dot within a 1 mm×1 mm area in a pattern of "CITYU". The experimental results indicate that the localization errors at most contact points are smaller than 0.06 mm and in the worst case is around 0.1 mm, which means the localization method achieves at least a 60-fold improvement of the localization accuracy as expected.

Testing the improvement of the localization accuracy is useful to evaluate the super-resolution ability of a designed sensor, however, it is noted that the above validation is conducted in an ideal setup, i.e., only the normal force is involved, and the output is the precise contact location. In practical applications (e.g., Braille recognition), it is usually hard to obtain the precise contact location because of the existence of the shear force, which thereby raises additional demands on "generalized super-resolution", i.e., encoding contact information in a more generalized manner (like abstract representations in high-dimensional space) using the least number of taxels.

In some preferred embodiment, since the electromechanical sensor encodes the contact information into high-level representations by properly processing measured signals of the 3D magnetic flux densities (containing information of both normal and shear forces) via deep learning, it has good adaptability for such generalized super-resolution applications in practice. More details about the application of the generalized super-resolution method will be introduced in the section of the real-time Braille character recognition.

Besides providing the precise contact location, the electromechanical sensor can also measure the force magnitude with a high resolution (with RMSE 0.01N). Given the contact location obtained from the super-resolution method, with reference to FIG. 4C, it is possible to then inversely look up the pressing (indentation) depth according to the readings of magnetic flux densities and (X, Y) coordinates from the pre-calibrated lookup tables.

Using the same method, referring to FIG. 4D, the force magnitude corresponding to a particular indentation depth may be obtained. Optionally, missing data can be filled in by applying linear interpolation. For example, if the contact location is (0.2 mm, 0.4 mm) relative to the center of the taxel S5, and the measured magnetic flux density $B_z^{S5}$ is 1475 uT, then the corresponding indentation depth would be 0.6 mm in FIG. 4C. The contact force related to the indentation depth (0.6 mm) would be 0.87N in FIG. 4D.

In summary, empowered by the deep-learning enhanced tactile super-resolution method, the electromechanical sensor can achieve a 60-fold improvement of the localization accuracy and measure the force magnitude with a high resolution, which is the best among the state-of-the-art super-resolution methods. The key insight behind such a high super-resolution and the force measurement ability is that the signal source of our sensor, i.e., the flexible magnet film, has a 3D continuous and smooth magnetic distribution in the space compared to the 1D discrete signals (capacitance, light intensity, and barometric pressure) in other methods.

These embodiments may be advantageous in that employing the continuous magnetic signals may achieve the same super-resolution as with other methods while using the least number of taxels, which is in agreement with the mission of the super-resolution technology: improving the physical resolution with the least number of sensing units.

Advantageously, the ability to measure the force magnitude makes the super-resolution technology more complete since most of the traditional super-resolution methods can only measure the force (contact) location. Benefited from these features, the electromechanical sensor could be a powerful solution to the tactile super-resolution technology in robotics.

The inventors devised that the electromechanical sensor in accordance with embodiments of the present invention may be used in different applications, such as sensor-based adaptive grasping and teleoperated needle threading.

For example, grasping a soft or fragile object has may be performed by dexterous robot hands. However, it remains a great challenge for robotic grippers to adapt to the external disturbance applied on the object (e.g., dragging force imposed on the object), since the shear force cannot be detected accurately. With the self-decoupling ability, our tactile sensor can meet such challenging requirements in robotics.

Figure 5A:
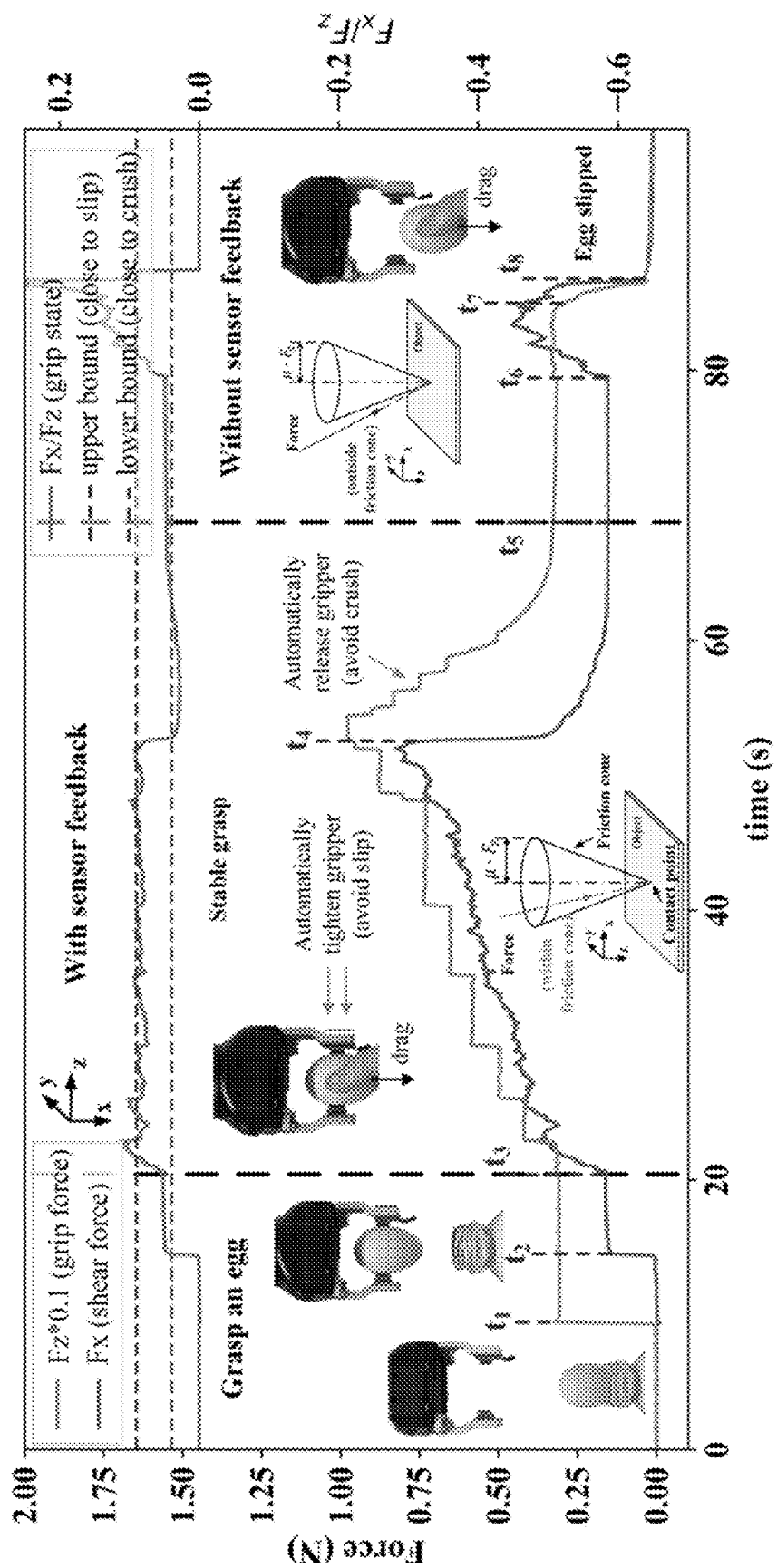
FIG. 5A is a plot showing results of an experiment that the tactile sensor is mounted on a robotic gripper for an "egg grasping" task. The output of the normal force $F_z$ indicates the real-time grip force, and the output of the shear force $F_x$ indicates the current shear force on one side of the gripper.

With reference to FIG. 5A, the electromechanical sensor may be mounted on a robotic hand (Robotiq HandE) for grasping of an egg with an external dynamic dragging. At the initial stage (0-$t_1$), the gripper is open and does not grasp anything; thereby both the gripping force $F_z$ and the shear force $F_x$ are zero (here $F_x$ is measured from one side of the gripper, and the actual measurement of the external force $F_x'$ along the x direction should be twice of $F_x$). Then, the gripper grabs the egg at $t_1$ and lifts it at $t_2$, where $F_z$ increases sharply from 0N to 3.1N, and $F_x$ increases slightly from 0N to 0.17N to counteract the egg's weight ($F_x' \approx 0.34$N). After the egg is grabbed stably, dragging the egg downwards by giving a random force $F_x'$, the maximum value of which is 1.6N (approximately five times larger than the initial value of $F_x'$). The change of the dragging force $F_x'$ is reflected in the growth curve of the shear force $F_x$, and the ratio $F_x/F_z$ rapidly approaches the boundary of the friction cone, which indicates that the egg is close to slipping from the gripper ($t_3$-$t_4$). In this dynamic procedure ($t_3$-$t_4$), the gripper adaptively increases the gripping force (from 3.1N to 9.7N) until $F_x/F_z$ drops into the safe area inside the friction cone to preclude slippage. When the dragging force is removed at $t_4$, the gripper reduces the gripping force gradually back to 3.1N until $F_x/F_z$ increases above the lower bound to prevent crushing the egg.

In this experiment, the opening/closing speed and step size of the gripper were set as 150 mm/s and 0.2 mm, respectively. The tactile signals were acquired with the Arduino Mega 2560 via I²C protocol and were then sent to a laptop to control the movement of the robotic arm (or gripper) via TCP/IP protocol. In addition, the response frequencies of both the robotic gripper and arm were limited at 1 Hz, and the sensor sampling rate was set as 10 Hz.

Figure 22:
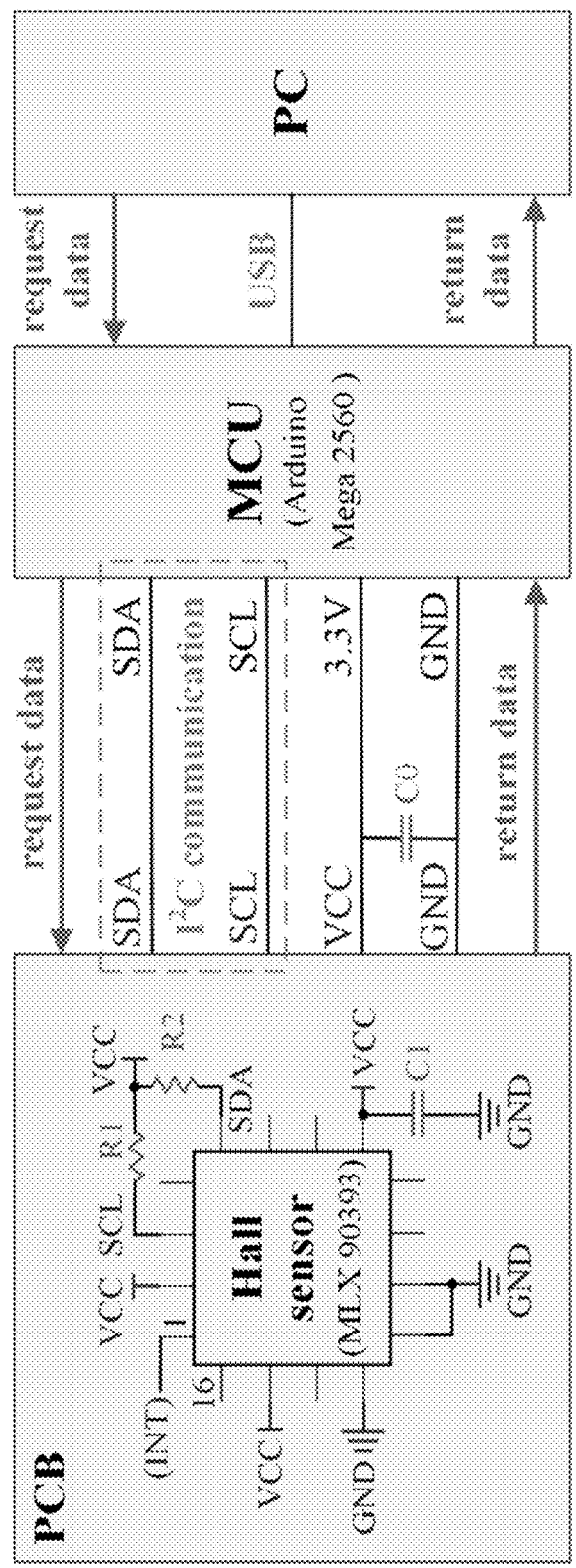
FIG. 22 is a schematic illustration of the data collection process.

With reference also to FIG. 22, the tactile data may be collected from the Hall sensor with an Arduino Mega 2560 via I²C protocol, and then sent to a laptop via USB cable for further processing. Preferably, only four wires are required for the I²C communication between an MCU (Microprogrammed Control Unit) and multiple Hall sensors (embedded on a PCB): SDA (Serial Data), SCL (Serial Clock), VCC (Power) and GND (Ground), because each I²C slave device (Hall sensor here) has a unique physical address and can be visited independently via a single I²C bus.

In the schematic circuit diagram of the PCB is as shown on the left side, where the MLX90393 chip (16 pin QFN package) is powered by the VCC/GND ports and queried by the SDA/SCL ports of the PCB. R1 and R2 are pull-up resistances (10 kΩ) required by the I²C protocol, and C0 and C1 are decoupling capacitors for canceling the AC noise from DC signals.

For comparison, a similar experiment has been conducted without using the sensor feedback ($t_5$-$t_8$). It shows the egg starts to slip at $t_7$ and drops at $t_8$, since the gripping force $F_z$ (3.1N) or the corresponding friction force (f=μ$F_z \approx$0.62N, where the friction coefficient μ≈0.2) is not adequate to counteract the external dragging force $F_x'$ (0.9N), i.e., $F_x/F_z$ falls outside the friction cone.

Figure 5B:
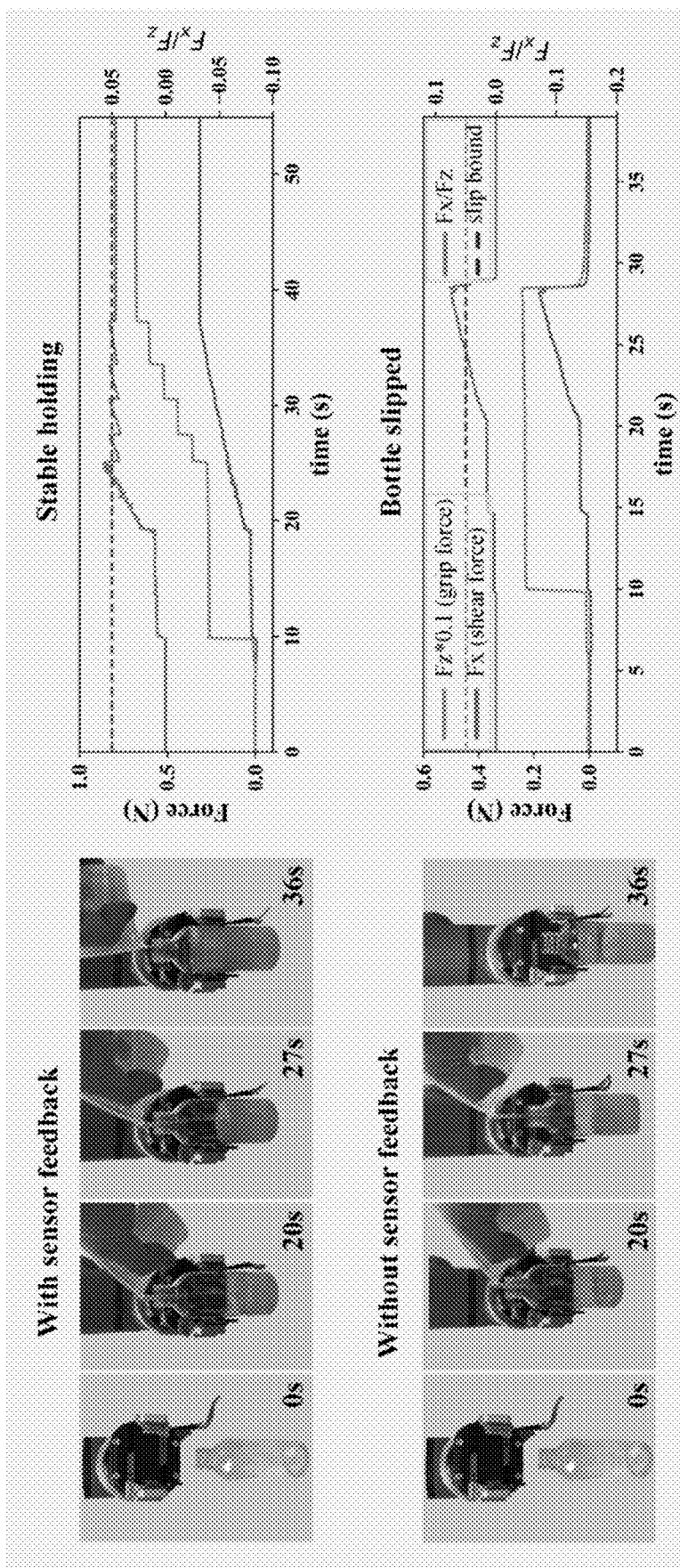
FIG. 5B are two series of captured images showing an experiment of holding a bottle while filling water into it. On the top, the bottle is stably held in the gripper with the force feedback from the tactile sensor. At the bottom, by contrast, the bottle slips during water filling without the force feedback.

With reference to FIG. 5B, to further demonstrate the ability of the electromechanical sensor in handling soft and slippery objects, an experiment was conducted to hold a plastic bottle being filled with water using the same control strategy. With the sensor feedback, the gripper can stably hold the bottle while filling ~60 ml (60 g) water into it, which is approximately 12 times larger than the initial weight (~5 g). In contrast, the bottle slips from the gripper when the volume of the water reaches ~30 ml if there is no sensor feedback.

These experiments demonstrate that the real-time feedback of both the normal and shear forces is crucial for slip prevention and effective grasping in robotic tasks, and at the same time, the tactile sensor exhibits the ability to improve the grasping stability and flexibility of existing robotic hands, which is important for robots to perform delicate operations especially in unstructured setups.

Figure 18:
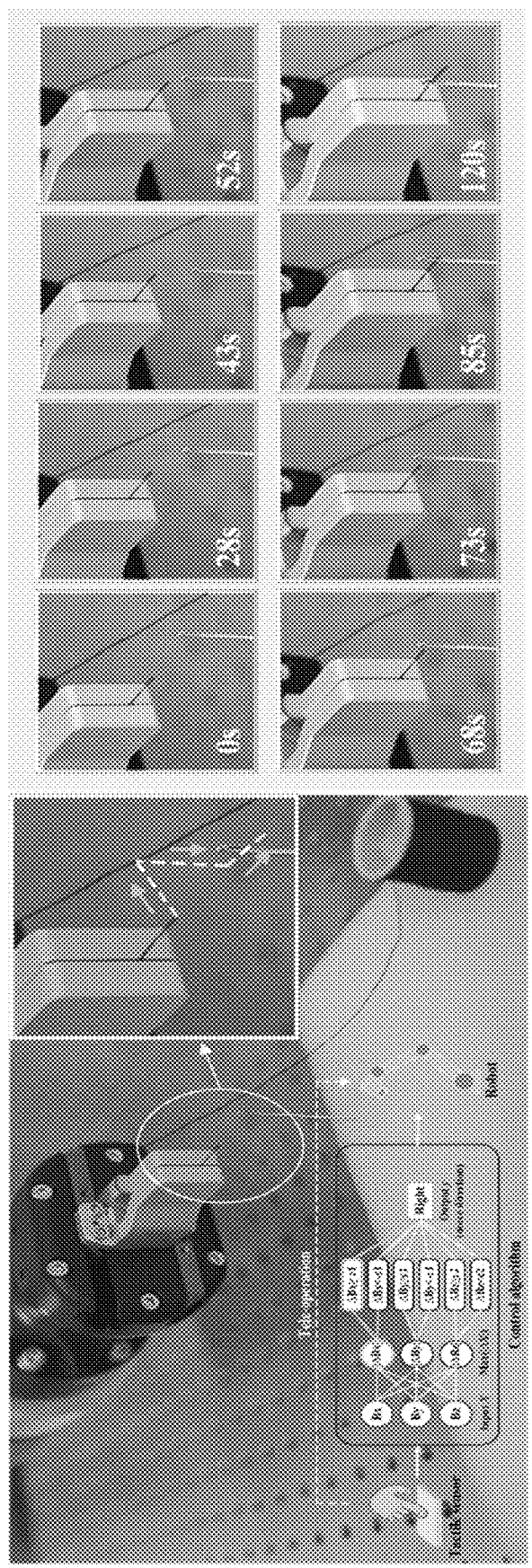
FIG. 18 is a series of images captured during a demonstration of teleoperated needle threading with a single cell of the sensor.

In addition, with reference also to FIG. 18, the sensor's super-resolution ability is also demonstrated by a needle threading task, where a flexible thread (with a 0.2 mm diameter) is pushed through a needle tip (with a 0.5 mm eye diameter) using a robot hand that is controlled by just a single taxel of the sensor.

In the tactile sensor-based teleoperation, a needle threading task was conducted where a flexible thread (with a 0.2 mm diameter) is pushed through a needle tip (with a 0.5 mm eye diameter) using a commercialized robot arm UR10e. The softness of the thin thread and the small eye of the needle requires high flexibility and accuracy of the teleoperation. A computer that connects both the tactile sensor and the robot may be used as the control center to receive and process the touch signals from the tactile sensor, and subsequently to send proper movement commands to the controller of the robot.

In this experiment, the overall procedure is conducted as follows: (i) the tactile sensor encodes the contact information as tactile signals in terms of 3D magnetic flux densities when a human finger touches the sensor in different regions; and then (ii) the tactile signals are decoded by a super-resolution algorithm according to the sign (positive/negative) and relative magnitude of the 3D magnetic flux densities, and then converted to a series of movement commands for the robot hand; and finally (iii) the robot controller executes the movement commands to move the robot hand towards a desired orientation with some appropriate step size (between 0.1 mm and 100 mm).

The movement commands are programmable, and in this case, they are defined in six directions, i.e., left, right, up, down, front and back. This is implemented by processing the tactile signals with the super-resolution algorithm as shown in the figure, where $\Delta B_x$ is the difference between the current magnetic flux density $B_x$ and $B_{x0}$ in the unloading condition, the activation threshold $c_1$ is set as 100 to make sure that no command can be incorrectly activated when nothing touches the sensor, and $c_2$ is set as 1000 to differentiate light and heavy touches.

It is worth noting that the needle threading task is accomplished by using only a single 8 mm×8 mm taxel. Compared with conventional sensor arrays that normally require six taxels, our sensor reduces the number of sensing units and the system complexity, making it suitable to serve as a compact pointing device on laptops and mobile devices, like a soft TrackPoint.

Figure 19:
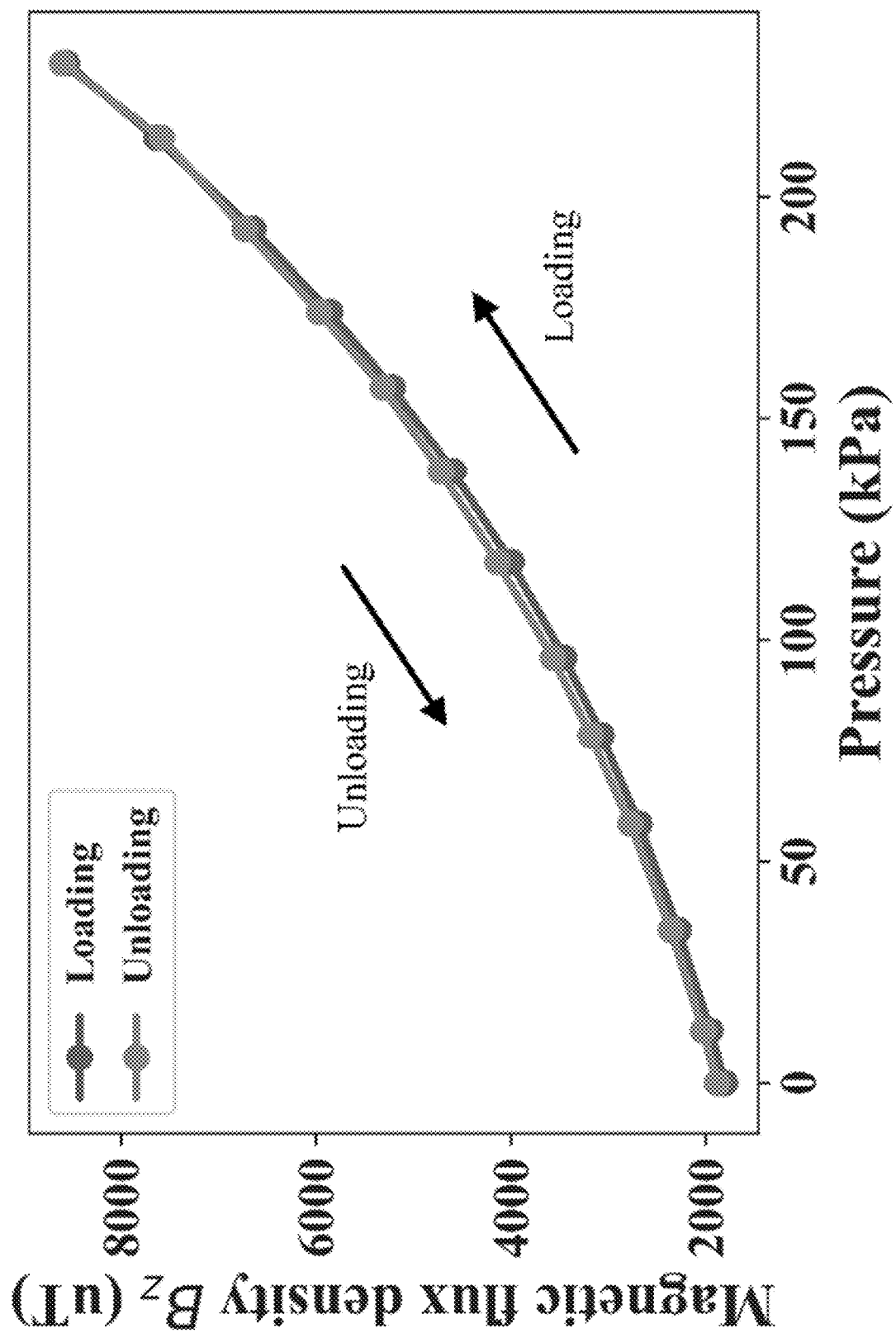
FIG. 19 is a plot showing a hysteresis curve of the sensor output during a cycle of loading and unloading (0~230 kPa).

Referring to FIG. 19, the hysteresis curve of the sensor is shown, which plots the sensor output during a cycle of loading and unloading (0~230 kPa). It is observed that the overall hysteresis of the sensor is relatively small, and the maximum hysteresis error is 3.5% (increased 143.15 uT at 117.6 kPa) during the unloading stage.

In an alternative example, the electromechanical sensor in accordance may be used in real-time Braille character recognition by natural sliding.

Braille is an efficient and significant tool for people who are visually impaired reading and writing to communicate with the world. Braille characters are small rectangular blocks including six dots (either raised or flat) in two columns, and there are in total 63 different patterns (except the "all flat" case). Usually it will take years of professional training to the level of reading a book fluently. To assist Braille learning, two types of methodologies are helpful. One is the computer vision and the other is the tactile sensing. Compared with the vision-based methods, the tactile sensor is more compact in size, more robust to disturbance (e.g., environmental light), regarded as an alternative solution in practice. However, existing tactile sensors can only realize Braille recognition by discontinuously pressing different characters one by one using six taxels (with each taxel for one dot), leading to a high device complexity but low reading efficiency.

For human Braille reading, the finger-sliding action is of great importance because it results in continuous variations of both normal and shear (friction) forces, which convey rich contact information for discriminating a specific Braille character. Such a process of Braille character recognition by sliding is a typical example solving the "generalized super-resolution" problem as mentioned in the super-resolution section, that is, the shear force introduced into the system caused by sliding action would inevitably reduce the localization accuracy of traditional super-resolution methods that only consider the normal force. With super-resolution and the capability to detect both normal and shear forces, the system can recognize each Braille character by a finger-like continuous sliding using only a single taxel rather than one-by-one pressing using tactile sensor arrays, which lowers the size and improves the portability.

Figure 6A:
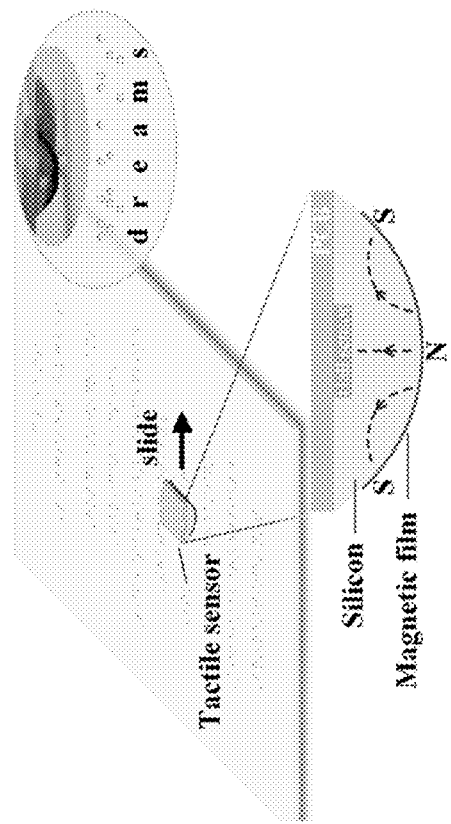
FIG. 6A is an illustration of the Braille character recognition with the tactile sensor with an arc-shaped surface.

With reference to FIG. 6A, to demonstrate the Braille character recognition, the sensor may include an arc-shaped tip (with radius ~6 mm) like the human fingerpad (with radius ~8 mm), which is then installed at the endpoint of a robot hand. When the sensor slides over the Braille characters with different embossed patterns, the flexible magnet tip deforms accordingly, and the measured magnetic flux densities ($B_x$, $B_y$, and $B_z$) along the x, y, and z directions also change in a particular manner.

Unlike the "reading by pressing" method that only involves the normal force, the sequential tactile signals ($B_x$, $B_y$, and $B_z$) involve both normal and shear contact information, which are fed into a neural network to predict the touched characters in a real-time manner as what human does. In particular, the magnitude variations of $B_x$ and $B_y$ are related to the position of the raised dots of each Braille character in the column and row directions, respectively, and $B_z$ is related to the overall pattern of the raised dots.

Figure 6B:
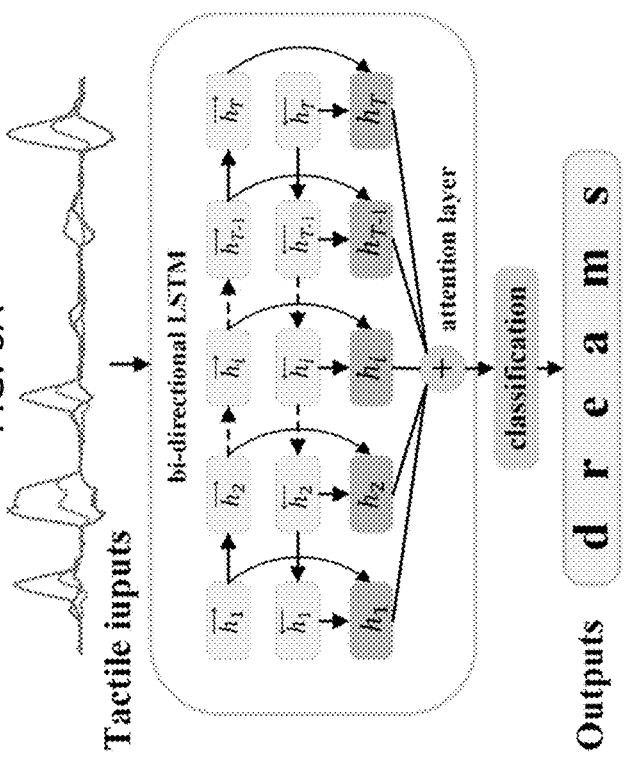
FIG. 6B is an illustration showing the architecture of the bi-directional LSTM neural networks with attention mechanism used for predicting Braille characters slid over by the tactile sensor.

As illustrated in FIG. 6B, a bi-directional LSTM (Long Short Term Memory) model may be employed with the attention mechanism for Braille character recognition. The inputs of the LSTM network are sequential tactile signals in terms of magnetic flux densities when sliding over each Braille character, and the outputs of the network are the probabilities (or scores) of all class labels for 26 English letters and three special symbols in the Braille alphabet. The class label with the highest score will be chosen as the final prediction based on a majority voting. Here, an attention layer is introduced to help the LSTM network learn how to focus on a particular part of the tactile signals that can distinguish characters with similar readings (like the letter "u" and "g" or "l" and "s").

The sensor was mounted at the end of the robotic arm (Universal Robot 10e) through a 3D-printed connector, and it slid over the Braille characters at the speed of 2 mm/s. When the sensor was put on the human fingertip, a ring-like connector with four "legs" was designed to keep the pressing depth (or contact force) the same during sliding, where each leg is 2.5 mm in diameter and 4.5 mm in length. The 3D-printed Braille board is in A4 size, on which all raised dots are 1 mm in height and 1.5 mm in diameter. The distance between two dots of each character is 2.5 mm in both horizontal and vertical directions, and the distance between two characters is 12 mm in the same row and 15 mm in two adjacent rows. For Braille character recognition on the robot, there are 902 Braille characters (including 26 English letters and three special symbols) in total for training the neural network and 163 characters for testing in real-time. For Braille character recognition on the human fingertip, there are 678 characters in the training set (collected with different finger poses and reading speed) and 68 characters in the test set. The training set (random Braille alphabets and symbols) and test set (a Braille poem) for Braille character recognition are completely different in the above demonstrations.

Figure 6C:
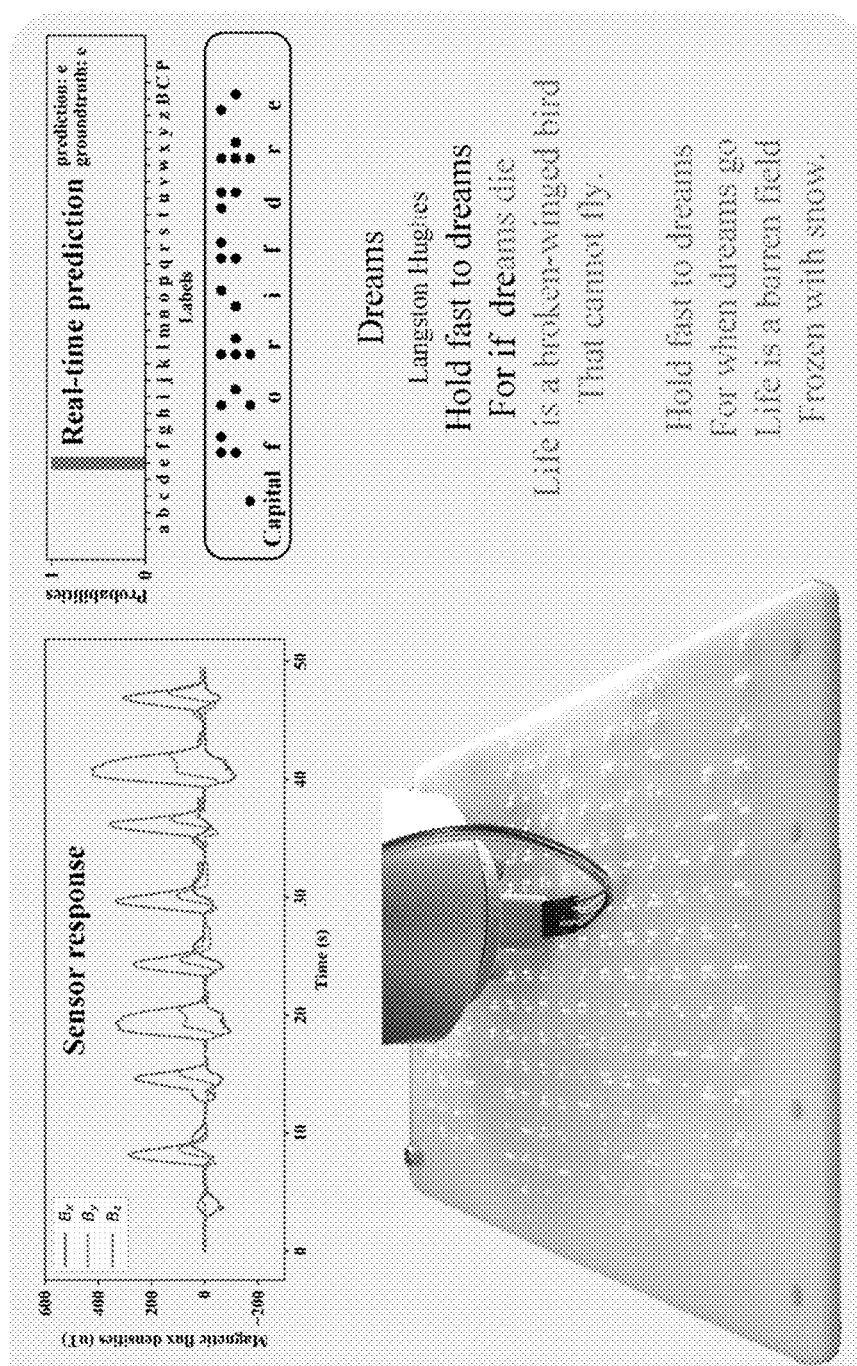
FIG. 6C is an illustration showing the experimental setup for the real-time recognition of the Braille poem Dreams, where the black-colored letters in the poem (lower right corner of the figure) are real recognitions, the orange-colored letters (like "h") are wrongly labeled ones, and the gray-colored letters are those to be read subsequently.

After training on around 900 instances of Braille characters, with reference to FIG. 6C, the system achieves a real-time recognition accuracy of 97% tested on the Braille poem Dreams with the sensor mounted on the robot, which is comparable to proficient human readers.

To further test its potential in helping blind people in the future, the tactile sensor (with "legs" for support) may be worn on the fingertip of a sighted people for Braille character recognition, and trained another LSTM model on 680 instances of Braille characters with different finger poses and reading speed. The real-time recognition accuracy on the fingertip is 78% (when the correct answer is the highest scored label of the Softmax layer) and 90% (when the correct answer is within the top three highest scored labels of the Softmax layer), with an average reading speed of 15 mm/s. The recognition accuracy on the fingertip is lower than that on the robot because the electromechanical sensor is sensitive to the variations of finger poses and reading speed, while the current training set is not large enough to cover all of such variations. Moreover, the alignment variation may result in similar sensor outputs for different characters (like the letter "e" and "o"), which increases the difficulty in recognition.

Since the moving speed of the robot was limited to 2 mm/s to prevent the sensor from being broken, and the reading speed is improved to 15 mm/s (or ~one character per 0.8 s) on the human fingertip, which is close to that of proficient human readers (~one character per 0.4 s for the fastest and 3.8 s for the slowest). The sensor's capability of recognizing Braille characters has been tested for sighted people, while it could be potentially used to help blind people read Braille in the future by further optimizing the sensor design and recognition algorithms.

Nonetheless, it is possible to further improve the accuracy of Braille character recognition on the fingertip. For example, the size of the training set may be increased by recognizing Braille characters with different finger poses and moving speed to cover the reading habits of different users. Moreover, the semantic association strategy may be employed in the prediction process (e.g., by taking into account natural language priors), by which characters with similar sensor outputs can be correctly recognized based on the context.

Without wishing to be bound by theory, precise tactile sensing plays a key role in the robotic manipulation, handling and interaction using robot hands. Although vast kinds of soft tactile sensors have been developed in recent years, they are still not comparable to the sensing ability of the skin, which owns the unique capability of simultaneous normal/shear force decoupling and tactile super-resolution.

Advantageously, the electromechanical sensor in accordance with embodiments of the present invention can inherently decouple the normal and shear forces and provides a tactile super-resolution with a 60-fold super-resolved accuracy, which significantly outperforms existing techniques. Its human skin-like ability helps to accomplish several challenging tasks in robotics, including the contact position tracking, adaptive grasping with external disturbance, teleoperated needle threading, and real-time Braille character recognition.

Advantageously, the tactile sensor may be designed to be a sandwich architecture inspired by the structure of the skin. In particular, the top layer is made of a soft magnetic film to perceive the applied force. Since the magnetic field is continuously distributed in 3D space, the induced deformation of the film can be easily recognized by the Hall sensor through the magnetic field change. Because the deformation is directly related to the material and structure, the measurement range and sensitivity can be largely adjusted by tuning the sensor's design parameters, i.e., either the thickness d and magnetic period T of the flexible magnet, or the thickness h and the elastic modulus E of the elastomer layer.

Besides the abovementioned preferred embodiments, more diversified tasks can be accomplished by designing a proper measurement range and sensitivity according to the actual application requirements. Advantageously, the tactile sensor can be easily extended to the form of discrete sensor arrays or even continuous electronic skin that can cover the entire body of the robot, e.g. by replacing the rigid PCB and discrete flexible magnet of the sensor with flexible printed circuits and a continuous flexible magnet sheet.

Moreover, the sensitivity and measurement range of such a sizeable electronic skin can be designed to vary in different regions by tuning the magnetic period of the flexible magnet locally without changing the thickness of the entire e-skin. Such property is similar to the diversified sensitivities and ranges of the human skin in different parts of the human body, e.g., at the fingertip or palm, which will be of great importance for applications that require different sensitivities and ranges of the robotic skin (e.g., at the robot hand or arm).

The sensor may be readily applied in applications such as contact position tracking, adaptive grasping and Braille character recognition, and the performance of the sensor has been verified with outstanding sensing capability. Further improvements can be made for these tasks by fully leveraging the properties of the sensor.

In the adaptive grasping tasks, the response frequency of both the robotic hand and arm are limited at 1 Hz due to the communication restrictions between the robot and the sensor, however, the response frequency of the robot can be further improved to match the maximum sampling rate of the tactile sensor (more than 100 Hz) by optimizing the communication procedure.

It is worth noting that in the examples described above, only the shear force in the x direction was considered, which therefore limited the one-directional shear force sensing ability of the sensor. This issue can be addressed by designing a circular magnetization pattern of the magnetic film.

In summary, the embodiments of the present invention provides a soft tactile sensor with both self-decoupling and super-resolution abilities, which are comparable to that of the human skin. The sensor eases several challenging tasks in robotics, such as contact position tracking, reliable grasping with external disturbance and Braille character recognition. In addition, it is shown that tactile sensor may be designed to benefit many fields in robotics, especially for delicate grasping, flexible manipulation, complex texture recognition, and friendly human-robot interaction.

In addition, it is verified that the sensor may achieve a 60-fold super-resolved accuracy enhanced by deep learning, which is the best among the state-of-the-art tactile super-resolution methods. With the tactile sensor being mounted at the fingertip, robots can leverage the large amount of tactile feedback to accomplish challenging tasks like stably grasping fragile objects under external disturbance and threading a needle via teleoperation. Moreover, the robot can also "read" Braille characters by simply sliding the sensor over the embossed characters with a real-time recognition accuracy of 97%, which is comparable to that of proficient human readers.

The inventors also performed other characterization tests and experiments to evaluate the performances of the sensor fabricated in accordance with embodiments of the present invention.

Figure 20:
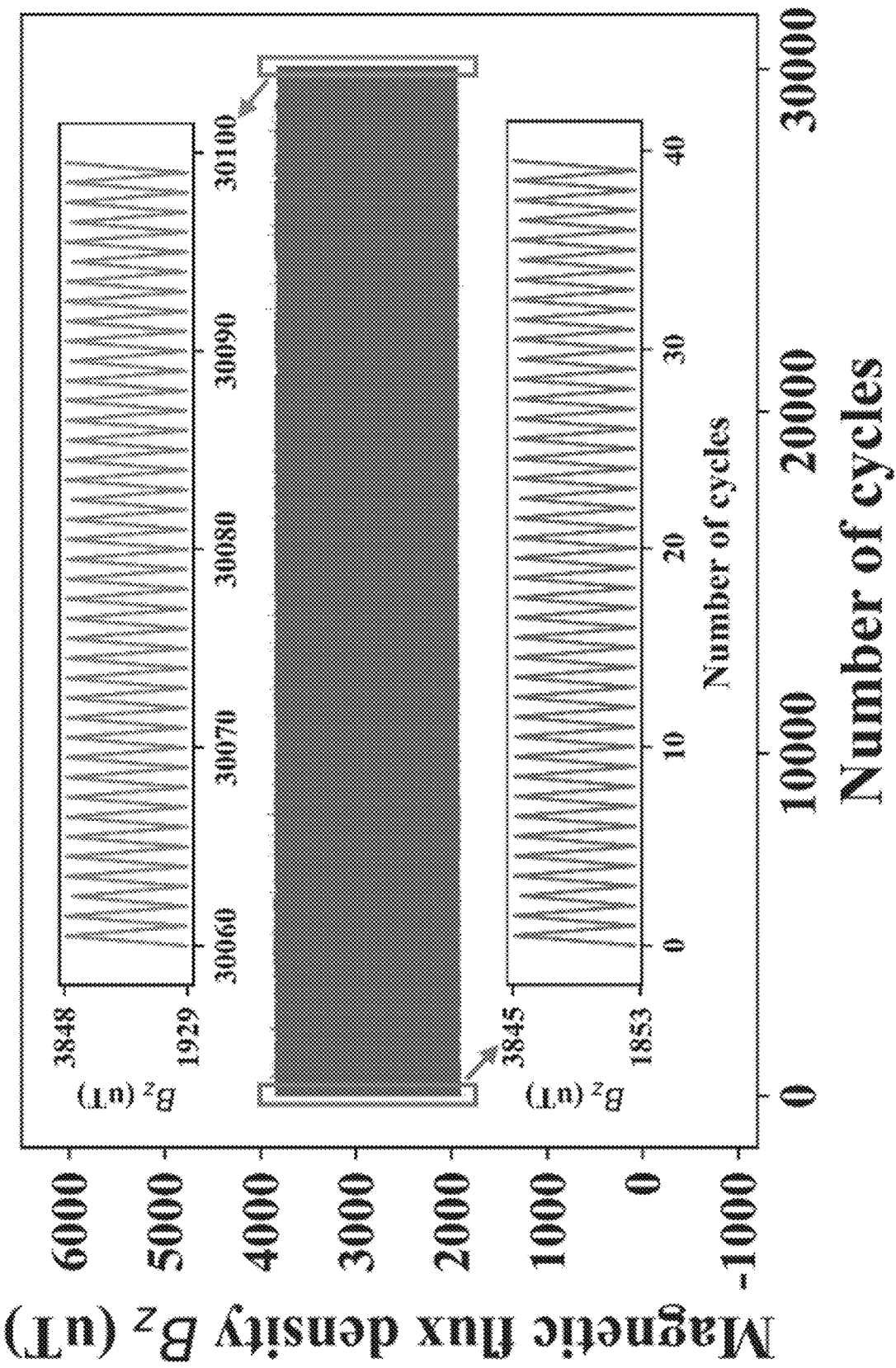
FIG. 20 is a plot showing results of a repeatability test of the sensor over 30,000 cycles.

Referring to FIG. 20, it is shown that the sensor response can be reproduced for tens of thousands number of cycles. After applying a pressure of 110 kPa and releasing to zero for more than 30,000 cycles (duration of one cycle: 6 s), the minimum and maximum values of measured magnetic flux density $B_z$ increased by 4.1% and 0.08%, respectively, suggesting that the electromechanical sensor is robust and repeatable for long-term usage.

Figure 21:
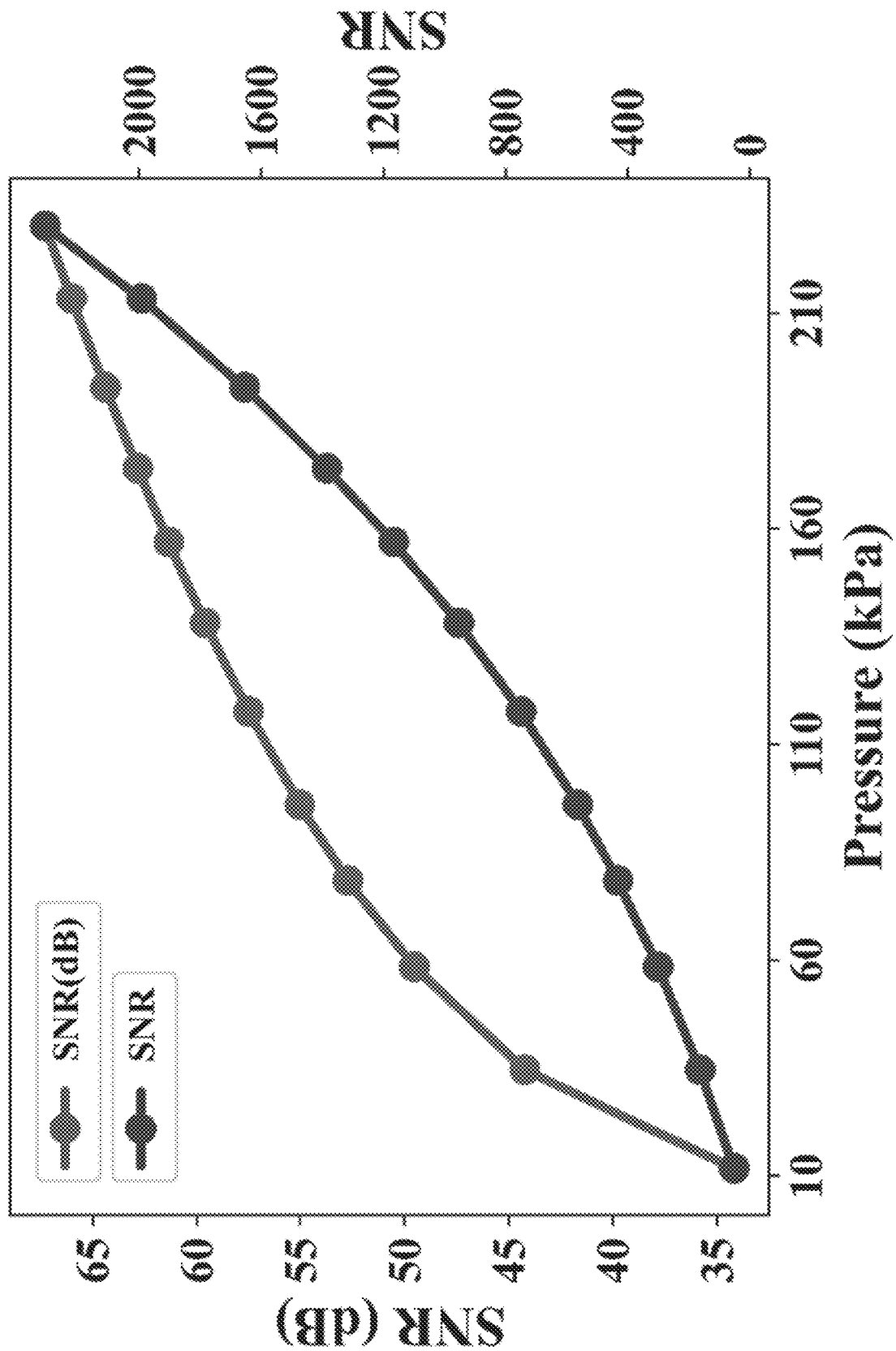
FIG. 21 is a plot showing signal-to-noise ratio (SNR) model of the sensor.

Referring to FIG. 21, The signal-to-noise ratio (SNR) of the sensor is high, which is defined as: $SNR=|\mu-\mu_0|/\sigma_0$ and $SNR_{dB}=20\log_{10}(|\mu-\mu_0|/\sigma_0)dB$., where $\mu$ and $\mu_0$ are the mean values of the sensor output when loaded and not loaded, respectively, and $\sigma_0$ is the standard deviation when not loaded. It is found that the sensor has a signal-to-noise ratio (SNR) of 51 (or 34 dB) at the pressure of 11.8 kPa, and greater SNRs can be obtained in scenarios with higher pressure.

Figure 23:
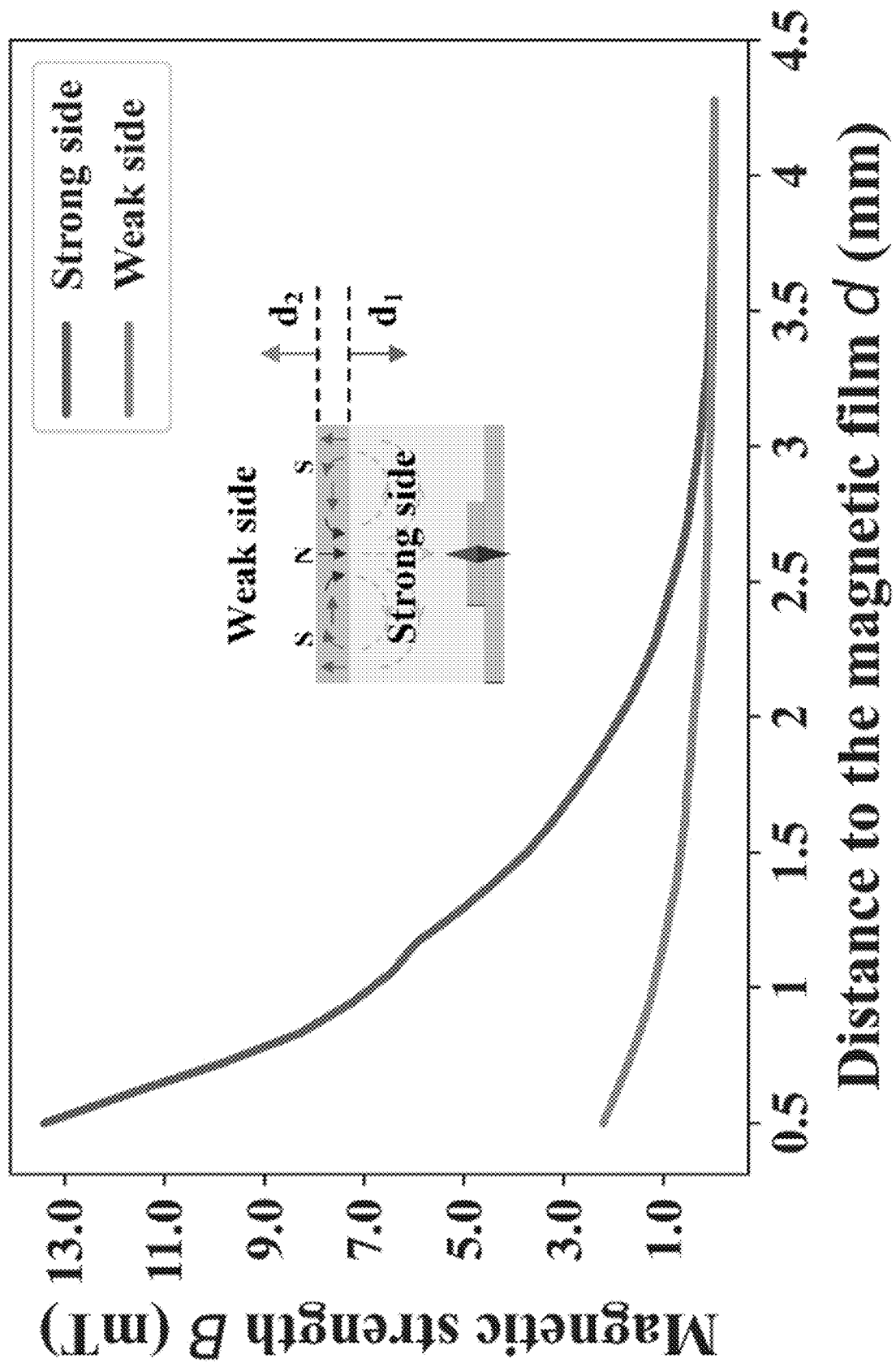
FIG. 23 is a plot showing measurements of magnetic strength on the strong and weak sides of the magnetic film.

Referring to FIG. 23, the magnetic film of the sensor is magnetized sinusoidally (in Halbach arrays) with multiple alternate north-south poles. Thus the magnetic field is strengthened on the one side (strong side) and canceled to zero (ideally) on the other side (weak side) as quantitively defined. However, it is hard to perfectly magnetize the magnetic film with a sinusoidal magnetization pattern in practice, so the magnetic strength on the two sides of the magnetic film is slightly different from the theoretical results.

It is observed that the maximum magnetic strength on the weak side is 2.2 mT (not zero as in the ideal case), which is 16.6% of that on the strong side (13.4 mT), and the magnetic strength on both sides of the magnetic film decays rapidly when leaving the surface of the film.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. An electromechanical sensor comprising:
a base provided with a magnetic sensor arranged to detect a change in magnetic flux at the position of the magnetic sensor;
a flexible film adjacent to the magnetic sensor; and
a magnetic element provided on the flexible film;
wherein the magnetic element is arranged to move relative to the magnetic sensor when the flexible film is reversibly deformed by an external force applied to the flexible film.

2. The electromechanical sensor in accordance with claim 1, wherein the magnetic element includes magnetic powders distributed across the flexible film.

3. The electromechanical sensor in accordance with claim 2, wherein the magnetic powders include neodymium.

4. The electromechanical sensor in accordance with claim 2, wherein the magnetic element has a non-uniform magnetization pattern across the flexible film.

5. The electromechanical sensor in accordance with claim 4, wherein the non-uniform magnetization pattern includes a sinusoidal pattern.

6. The electromechanical sensor in accordance with claim 5, wherein the sinusoidal pattern repeats periodically along at least one axis of the flexible film.

7. The electromechanical sensor in accordance with claim 6, wherein the sinusoidal pattern repeats periodically and radially thereby defining the magnetization pattern with a plurality of concentric rings.

8. The electromechanical sensor in accordance with claim 2, wherein magnetic powders form a Halbach array.

9. The electromechanical sensor in accordance with claim 1, wherein the flexible film comprises a polymer.

10. The electromechanical sensor in accordance with claim 9, wherein the polymer includes polydimethylsiloxane.

11. The electromechanical sensor in accordance with claim 1, wherein the magnetic sensor is aligned with a magnetic pole of the magnetic element.

12. The electromechanical sensor in accordance with claim 11, wherein the magnetic sensor includes at least one hall sensor mounted on the base.

13. The electromechanical sensor in accordance with claim 12, wherein the base comprises a printed circuit board.

14. The electromechanical sensor in accordance with claim 13, wherein the base comprises a flexible printed circuit.

15. The electromechanical sensor in accordance with claim 12, wherein the magnetic sensor includes an array of hall sensors mounted on the base.

16. The electromechanical sensor in accordance with claim 1, wherein the flexible film defines a curved sensing surface.

17. The electromechanical sensor in accordance with claim 1, further comprises a spacer layer between the base and the flexible film.

18. The electromechanical sensor in accordance with claim 17, wherein the spacer layer is arranged to partially absorb the external force applied to the flexible film and/or to restore the flexible film to an original state.

19. The electromechanical sensor in accordance with claim 17, wherein the spacer layer comprises an elastomer material.

20. The electromechanical sensor in accordance with claim 19, wherein the elastomer material includes silicone.

21. The electromechanical sensor in accordance with claim 1, wherein the external force includes a combination of shear force and normal force.

22. The electromechanical sensor in accordance with claim 17, wherein the magnetic sensor is arranged to decouple the combined external force to the shear force and the normal force applied to the flexible film.

23. A sensor array comprising a plurality of electromechanical sensors in accordance with claim 1.

24. A method of sensing an object or a tactile input, comprising the steps of:
  receiving a detection signal provided by the magnetic sensor in the electromechanical sensor in accordance with claim 22, wherein the detection signal is generated in response to a movement of the magnetic element on the flexible film,
  decoupling the external force to a shear force component and a normal force component in terms of a magnetic ratio $R_B$ and a magnetic strength B of the magnetic flux sense by the magnetic sensor; and
  determining the shear force and the normal force applied to the flexible film.

25. The method of claim 24, further comprising the step of processing the detection signal to determine a position and/or a depth of a pressing force applied to the flexible film.

26. The method of claim 25, wherein the step of processing the detection signal includes processing a magnetic flux density of neighbouring taxels in the magnetic sensor around the position of the pressing force applied to the flexible film.

27. The method of claim 25, wherein the step of processing the detection signal includes measuring a magnetic flux density at the position of the pressing force applied to the flexible film to determine the depth of the pressing force with reference to a pre-calibrated lookup table.

28. The method of claim 25, wherein the step of processing the detection signal includes measuring the depth at the position of the pressing force applied to the flexible film to determine a force magnitude of the pressing force with reference to a pre-calibrated lookup table.

29. The method of claim 25, wherein the step of processing the detection signal include estimating coordinates of the position of the pressing force applied to the flexible film using a neural network.

30. The method of claim 25, further comprising the step of tracking a motion of an object corresponding to external forces applied on the flexible film by the object during a predetermined period of time.

* * * * *